(12) United States Patent
Bailey et al.

(10) Patent No.: US 7,901,596 B2
(45) Date of Patent: *Mar. 8, 2011

(54) METAL COMPOSITIONS, THERMAL IMAGING DONORS AND PATTERNED MULTILAYER COMPOSITIONS DERIVED THEREFROM

(75) Inventors: Richard Kevin Bailey, Newark, DE (US); Graciela Beatriz Blanchet, Wilmington, DE (US); Jonathan V Caspar, Wilmington, DE (US); John Catron, Jr., Smyrna, DE (US); Reid John Chesterfield, Santa Barbara, CA (US); Thomas C. Felder, Kennett Square, PA (US); Feng Gao, Hockessin, DE (US); Lynda Kaye Johnson, Wilmington, DE (US); Roupen Leon Keusseyan, Raleigh, NC (US); Dalen E. Keys, Landenberg, PA (US); Irina Malajovich, Swarthmore, PA (US); Jeffrey Scott Meth, Landenberg, PA (US); Geoffrey Nunes, Swarthmore, PA (US); Gerard O'Neil, Newark, DE (US); Rinaldo Soria Schiffino, Wilmington, DE (US); Nancy G. Tassi, Gibbstown, NJ (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/487,883

(22) Filed: Jun. 19, 2009

(65) Prior Publication Data

US 2009/0297739 A1 Dec. 3, 2009

Related U.S. Application Data

(63) Continuation of application No. 11/488,247, filed on Jul. 17, 2006, now Pat. No. 7,582,403.

(51) Int. Cl.
*H01B 1/02* (2006.01)
*H01B 1/22* (2006.01)
(52) U.S. Cl. ......................................... 252/512; 252/514
(58) Field of Classification Search .................... 430/18, 430/200, 964; 252/500, 503, 512, 514; 428/32.74
See application file for complete search history.

(56) References Cited

U.S. PATENT DOCUMENTS

| 5,312,683 A | 5/1994 | Chou et al. |
| 5,685,939 A | 11/1997 | Wolk et al. |
| 5,826,329 A | 10/1998 | Roth |

(Continued)

FOREIGN PATENT DOCUMENTS

DE  10 2005 019983 A1  11/2006

(Continued)

OTHER PUBLICATIONS

International Search Report For International Application No. PCT/US2007/016111 Dated Sep. 9, 2008.

(Continued)

*Primary Examiner* — Cynthia H Kelly
*Assistant Examiner* — Chanceity N Robinson

(57) ABSTRACT

Metal compositions including silver compositions are used in preparing thermal imaging donors. The donors are useful for thermal transfer patterning of a metal layer and optionally, a corresponding proximate portion of an additional transfer layer onto a thermal imaging receiver. The compositions are useful for dry fabrication of electronic devices. Also provided are patterned multilayer compositions comprising one or more base film(s), and one or more patterned metal layers, including EMI shields and touchpad sensors.

3 Claims, 7 Drawing Sheets

U.S. PATENT DOCUMENTS

| | | |
|---|---|---|
| 6,586,153 B2 | 7/2003 | Wolk et al. |
| 7,528,448 B2 * | 5/2009 | Bailey et al. .................. 257/352 |
| 2003/0151030 A1 | 8/2003 | Gurin |
| 2003/0196833 A1 | 10/2003 | Fujii |
| 2004/0238910 A1 | 12/2004 | Fujii |
| 2005/0082523 A1 | 4/2005 | Blanchet-Fincher |
| 2005/0087289 A1 | 4/2005 | Toyada |
| 2008/0012006 A1 * | 1/2008 | Bailey et al. .................... 257/40 |
| 2008/0057233 A1 | 3/2008 | Harrison et al. |
| 2009/0179198 A1 * | 7/2009 | Bailey et al. .................... 257/40 |

FOREIGN PATENT DOCUMENTS

| | | |
|---|---|---|
| EP | 0 099 228 A | 1/1984 |
| EP | 0 099 228 A3 | 1/1984 |
| EP | 0099228 A2 * | 1/1984 |
| EP | 0 717 418 A | 6/1996 |
| GB | 1 129 112 A | 10/1968 |
| GB | 1129112 | 10/1968 |
| JP | 01 008091 A | 1/1989 |
| WO | 94/25518 A | 11/1994 |
| WO | WO 94/25518 | 11/1994 |
| WO | 03/035279 A | 5/2003 |

OTHER PUBLICATIONS

PCT Results of Partial International Search for International Application No. PCT/US2007/16111.

* cited by examiner

METAL COMPOSITIONS, THERMAL IMAGING DONORS AND PATTERNED MULTILAYER COMPOSITIONS DERIVED THEREFROM

This invention was made with United States Government support under Agreement No. 70NANB2H03032 awarded by NIST Advanced Technology Program. The United States Government has certain rights in the invention.

FIELD OF THE INVENTION

The invention relates to metal/polymer compositions and thermal imaging donors for printing electronic circuits.

BACKGROUND

Thermal transfer processes are well known in applications such as color proofing as a means of dry transferring or printing of dye and/or pigment layers. Such thermal transfer processes typically use a laser to induce the image-wise thermal transfer of material.

Laser-induced thermal transfer processes typically use a donor element, including a layer of material to be transferred, referred to herein as a transfer layer, and a receiver element, including a surface for receiving the transferred material. Either the substrate of the donor element or the receiver element is transparent, or both are transparent. The donor element and receiver element are brought into close proximity or into contact with each other and selectively exposed to laser radiation, usually by an infrared laser. Heat is generated in the exposed portions of the transfer layer, causing the transfer of those portions of the transfer layer onto the surface of the receiver element. If the material of the transfer layer does not absorb the incoming laser radiation, the donor element should include a heating layer, also known as a light-to-heat conversion (LTHC) layer or a transfer-assist layer, in addition to the transfer layer.

In a typical laser-induced digital thermal transfer process the exposure takes place only in a small, selected region of the assembly at a time, so that transfer of material from the donor element to the receiver element can be built up one region at a time. The region may be a pixel, some portion of a pixel or a plurality of pixels. Computer control facilitates the transfer at high speed and high resolution. Alternatively, in an analog process, the entire assembly is irradiated and a mask is used to selectively expose desired portions of the thermally imageable layer.

There are several known examples of thermal transfer of layers for the construction of electronic devices. Representatives are U.S. Pat. No. 6,114,088 and WO 2004/087434.

There is a need for thermal imaging donors that allow patterned thermal transfer of conducting metal layers that exhibit good transfer properties and good adhesion to a variety of receivers. Particularly desirable are thermal imaging donors wherein, after transfer, no further heating, or firing, of the patterned layer is required to achieve a high conductivity metal layer.

SUMMARY OF INVENTION

One aspect of the invention is a metal composition (A) comprising: (a) about 65 to about 95 wt %, based on the total weight of the metal composition, of a metal powder selected from the group: Ag, Cu and alloys thereof; comprising a plurality of metal particles having an average longest dimension of about 5 nm to about 1500 nm; and (b) about 5 to about 35 wt % of a dispersant comprising one or more resins selected from the group: conducting polymers selected from the group: polyaniline, polythiophene, polypyrrole, polyheteroaromatic vinylenes, and their derivatives; and nonconducting polymers selected from the group: acrylic and styrenic-acrylic latexes, and solution-based acrylics and styrenic-acrylic (co)polymers, and combinations thereof; copolymers of ethylene with one or more monomers selected from the group: (meth)acrylate(s), vinyl acetate, carbon monoxide and (meth)acrylic acid; polyvinylacetate and its copolymers.

Another aspect of the invention is a multilayer thermal imaging donor comprising: a base film and a metal transfer layer, wherein said metal transfer layer comprises the metal composition (A).

Another aspect of the invention is a patterned multilayer composition comprising: (a) one or more base film(s); and (b) one or more patterned metal layer(s);

wherein the patterned metal layer(s) has at least one linewidth of about 1 millimeter or less, and comprises the metal composition (A).

The compositions and donors provide thermal transfer patterning of metal layers onto thermal transfer receivers. The patterned metal layers require no post-firing or annealing to induce the conductivity required for electronic circuitry. The thermal imaging process is dry and hence does not involve solvent incompatibility issues with any layers, which may already have been deposited.

DETAILED DESCRIPTION

Figure 1A:
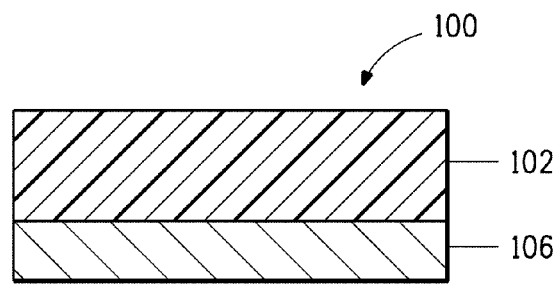
FIG. 1A is a cross-sectional view of a thermal imaging donor 100 comprising a metal transfer layer 106 and a base film 102.

Herein the terms "acrylic", "acrylic resin", "(meth)acrylic resins", and "acrylic polymers", are synonymous unless specifically defined otherwise. These terms refer to the general class of addition polymers derived from the conventional polymerization of ethylenically unsaturated monomers derived from methacrylic and acrylic acids and alkyl and substituted-alkyl esters thereof. The terms encompass homopolymers and copolymers. The terms encompass specifically the homopolymers and copolymers of methyl (meth) acrylate, ethyl (meth)acrylate, butyl (meth)acrylate, 2-hydroxyethyl (meth)acrylate, (meth)acrylic acid and glycidyl (meth)acrylate. The term copolymer herein encompasses polymers derived from polymerization of two or more monomers, unless specifically defined otherwise. The term (meth) acrylic acid encompasses both methacrylic acid and acrylic acid. The term (meth)acrylate, encompasses methacrylate and acrylate.

The terms "styrene acrylic polymers", "acrylic styrene" and "styrene acrylic" are synonymous and encompass copolymers of the above described "acrylic resins" with styrene and substituted styrene monomers, for instance alpha-methyl styrene.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

Metal Composition

One embodiment of the invention is a metal composition (A) comprising: (a) about 65 to about 95 wt %, based on the total weight of the metal composition, of a metal powder selected from the group consisting of: Ag, Cu and alloys thereof; comprising a plurality of metal particles having an average longest dimension of about 5 nm to about 1500 nm; and (b) about 5 to about 35 wt % of a dispersant comprising one or more resins selected from the group consisting of: conducting polymers selected from the group consisting of: polyaniline, polythiophene, polypyrrole, polyheteroaromatic vinylenes, and their derivatives; and nonconducting polymers selected from the group consisting of: acrylic and styrenic-acrylic latexes, and solution-based acrylics and styrenic-acrylic (co)polymers, and combinations thereof; copolymers of ethylene with one or more monomers selected from the group consisting of: (meth)acrylate(s), vinyl acetate, carbon monoxide and (meth)acrylic acid; polyvinylacetate and its copolymers.

Preferably the metal composition (A) comprises about 85 to about 90% metal powder with an average particle size of between 100 nm and about 400 nm. In one preferred embodiment the metal powder is silver metal flake, with an average equivalent spherical diameter of about 100 to about 900 nm. In various aspects of the invention the metal composition (A) comprises 96 wt % or greater, and preferably 98 wt % or greater, of components (a) and (b) as stated above. In another aspect the metal composition (A) consists essentially of the components (a) and (b) as stated above.

The metal composition (A) of the invention, relative to conventional compositions, has high loadings of metal particles. The composition is useful in preparing metal transfer layers. The metal composition (A) is unique in that it provides a conducting layer after thermal transfer, without the need for firing or burning-off of polymer binders.

Silver is a preferred metal powder for the compositions. Preferred alloys include Ag—Pd, Ag—Pt and Ag—Cu. The metal powders are readily available from several commercial sources including: Ferro Corp., Electronic Materials Systems, South Plainfield, N.J.; Nanostructured & Amorphous Materials, Houston, Tex.; Inframat® Advanced Materials, Farmington, Conn.; Sumitomo Metal Mining Co., Ltd., Tokyo, Japan; and Mitsui Mining and Smelting Co., Ltd. Tokyo, Japan.

"Dispersant" refers to non-volatile organic or inorganic material that is used as a carrier or matrix medium for the metal particles. The dispersant includes one or more of the following components: polymers, oligomers, surface treatments, plasticizers, processing aids such as defoamers, surfactants, stabilizers, coating aids, pigments, dyes including near infrared dyes, and the like. The dispersant has several functions including: allowing the dispersion of the metal particles so they are evenly distributed and applied as transfer layers; and contributing to the transfer properties, most notably the relative adhesion of the metal transfer layers to the donor element and the thermal imaging receiver in the thermal transfer process. The dispersant also may contribute to the functional properties of the transfer layers. For instance, the dispersant may be a conducting polymer.

The properties of the dispersant refer to the bulk properties of the fully formulated dispersant formulations, unless specifically noted. Preferred dispersants are polymers having a Tg of about −30° C. to about 90° C., and more preferably, about 30° C. to about 70° C.

Polymers useful as dispersants in the invention include conducting organic polymers and doped versions of these polymers, e.g., polyaniline, polythiophene, polypyrrole, polyheteroaromatic vinylene, polyfuran, poly(para-phenylene), poly(phenylenevinylene), polyisothianaphthene, polyparaphenylene sulphide, and their derivatives. Preferred derivatives fall in one or more of the following categories: (a) stable conducting polymers such as polyaniline (PANI) and polyethylene dioxythiophene (PEDOT); (b) soluble or dispersible conducting polymers that form films using standard coating techniques, including PANI, PEDOT; and other alkyl- or alkoxy-substituted derivatives of conducting polymers such as poly(2,5 dialkoxy)paraphenylene vinylene and poly(3-hexyl)thiophene); and (c) conducting polymers that give high conductivity upon doping. Preferred conducting polymers are selected from the group consisting of: polyaniline; polythiophene; polypyrrole; polyheteroaromatic vinylenes; and their derivatives; preferably at a level of 1 to about 5 wt % based on the dry weight of the metal transfer layer composition.

Further polymers useful as dispersants are those selected from the group consisting of: acrylic and styrenic-acrylic latexes and solution-based acrylic and styrenic-acrylic (co) polymers including random and graft copolymers; and combinations thereof; copolymers of ethylene with one or more monomers selected from the group consisting of: (meth)acrylates, vinyl acetate, carbon monoxide and (meth)acrylic acid; polyvinylacetate and its copolymers; and polyvinylpyrrolidone and its copolymers including polyvinylpyrrolidone-co-vinyl acetate. Preferably the solvent-soluble polymers within the group are characterized by an $M_w$ of about 10,000 to about 200,000. A preferred dispersant comprises resins selected from the group consisting of: acrylic and styrenic-acrylic latexes, and solution-based acrylics and styrenic-acrylic (co) polymers, and combinations thereof.

The dispersant may comprise up to about 10 wt % of one or more resin additives selected from the group of consisting of: pigments, dyes and conducting particles selected from the group consisting of: carbon black, carbon nanotubes, and modifying metal and metal alloy powders. Preferred modifying metals are Au and Pd. A preferred composition comprises 0.5 wt % to about 10 wt % of the conducting additive with an average particle size greater than 5 nm and less than about 1500 nm. The most preferred conducting additives are carbon black and carbon nanotubes. Preferably the metal composition (A) further consists essentially of 0.5 wt % to about 10 wt % of the conducting additive with an average particle size greater than 5 nm and less than about 1500 nm. In another embodiment preferred additives are near-infrared dyes and more preferably, are cyanine compounds selected from the group: indocyanines, phthalocyanines including polysubstituted phthalocyanines and metal-containing phthalocyanines, and merocyanines.

Lower molecular weight oligomers and small molecules useful as processing aids in the dispersant include surfactants, for instance, those comprising siloxy-, fluoryl-, alkyl- and alkynyl-substituted surfactants. These include the Byk® (Byk Chemie), Zonyl® (DuPont), Triton® (Dow), Surfynol® (Air Products) and Dynol® (Air Products) surfactants. Preferred are Byk® 345, 346 and 348 and Zonyl® FSO and FSN surfactants.

The metal composition (A) is typically prepared by mixing metal powder and the dispersant with a volatile carrier fluid to provide a fluid dispersion. Typically the volatile carrier fluid is water, an organic solvent, a gaseous material, or some combination thereof. The volatile carrier fluid is chosen to be compatible with the metal particles and any optional dispersant that is used. Examples of volatile carrier fluids include water, lower alcohols such as ethanol, aliphatic and aromatic hydrocarbons such as hexane, cyclohexane and xylenes; ethers such as dibutyl ether; ether alcohols such as 2-methoxyethanol; esters such as butyl acetate; and aliphatic and aromatic halocarbons such as 1,2-dichloroethane.

Multilayer Thermal Imaging Donor

Another embodiment of the invention is a multilayer thermal imaging donor. In various embodiments the donor comprises, in layered sequence, a base film, and optional LTHC layer, a metal transfer layer and an optional protective strippable cover layer. The metal transfer layer comprises the metal composition (A) as described above. In one embodiment the metal transfer layer consists essentially of the metal composition (A) as described above. Other embodiments can include one or more additional transfer layers interposed between the base film and the metal transfer layer and/or on top of the metal transfer layer. Thus, one or more other conventional thermal transfer donor element layers can be included in the thermal imaging substrate useful in the present invention, including but not limited to an interlayer, primer layer, release layer, ejection layer, thermal insulating layer, underlayer, adhesive layer, humectant layer, and light attenuating layer.

FIG. 1A is a cross-sectional view of thermal imaging donor 100, in accordance with one embodiment of the invention. Thermal imaging donor 100 comprises a base film 102 and a metal transfer layer 106 comprising a novel metal composition dispersed on the surface of the base film.

Base film 102 provides support to the other layers of thermal imaging donor 100. Base film 102 comprises a flexible polymer film that is preferably transparent and remains stable despite heating of the LTHC or other layers. A suitable thickness for base film 102 is about 25 µm to about 200 µm, although thicker or thinner support layers may be used. The base film may be stretched by standard processes known in the art for producing oriented films and one or more other layers, such as the LTHC layer, may be coated onto the base film prior to completion of the stretching process. Preferred base films for thermal imaging donors comprise a polymeric material selected from the group consisting of: polyethylene terephthalate (PET), polyethylene naphthalate (PEN), triacetyl cellulose and polyimide.

Light-Attenuating Agent

A light-attenuating agent may be present in a discrete layer or incorporated in one of the other functional layers of the donor element, such as the base film, the LTHC layer or in an additional transfer layer. In one embodiment, the base film comprises a small amount (typically 0.2% to 0.5% by weight of the base film) of a light-attenuating agent such as a dye which can assist in the focusing of the radiation source onto the radiation-absorber in the LTHC layer during the thermal imaging step, thereby improving the efficiency of the heat transfer. U.S. Pat. No. 6,645,681, incorporated herein by reference, describes this and other ways in which the base film may be modified to assist in the focusing of a laser radiation source in which the equipment comprises an imaging laser and a non-imaging laser wherein the non-imaging laser has a light detector that is in communication with the imaging laser. Herein, the light attenuating agent preferably absorbs or diffuses light in the visible region, and in one embodiment absorbs around 670 nm. Suitable light-attenuating agents are well known in the art and include the commercially available Disperse Blue 60 and Solvent Green 28 dyes and carbon black. Preferably the amount of light-attenuating agent is sufficient to achieve an optical density (OD) of 0.1 or greater at some wavelength of about 400 to about 750 nm, and more preferably about 0.3 to about 1.5.

Light to Heat Conversion Layer (LTHC)

Figure 1B:
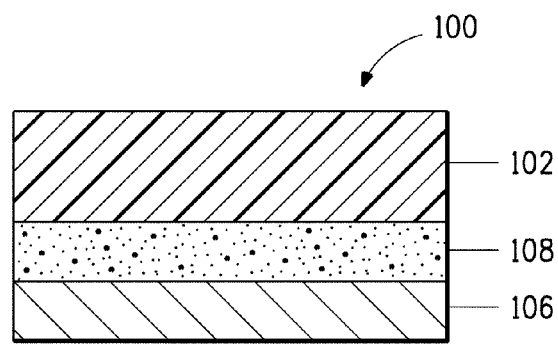
FIG. 1B is a cross-sectional view of thermal imaging donor 100 comprising a LTHC layer 108.

The thermal imaging donor may, optionally, have a light-to-heat-conversion layer (LTHC), interposed between the base film and the other layers. FIG. 1B is a cross-sectional view of thermal imaging donor 100, in accordance with another embodiment of the invention. Thermal imaging donor 100 comprises a LTHC layer 108 interposed between base film 102 and the metal transfer layer 106.

The LTHC layer 108 is incorporated as a part of thermal imaging donor 100 for radiation-induced thermal transfer to couple the energy of light radiated from a light-emitting source into the thermal transfer donor.

Typically, the radiation absorber in the LTHC layer (or other layers) absorbs light in the infrared, visible, and/or ultraviolet regions of the electromagnetic spectrum and converts the absorbed light into heat. The radiation absorber is typically highly absorptive, providing an optical density (OD) at the wavelength of the imaging radiation of 0.1 to 3 or higher, and preferably from 0.2 to 2.

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Suitable radiation absorbers and binders for LTHC layers are well-known in the art and extensive lists and references can be found in PCT/US05/38010; PCT/US05/38009; U.S. Pat. No. 6,228,555 B1; Matsuoka, M., "Infrared Absorbing Materials", Plenum Press, New York, 1990; and Matsuoka, M., Absorption Spectra of Dyes for Diode Lasers, Bunshin Publishing Co., Tokyo, 1990; which are herein incorporated by reference. One example of a suitable LTHC layer can include a pigment, such as carbon black, and a binder, such as an organic polymer. A preferred class of near-infrared dyes are cyanine compounds selected from the group: indocyanines, phthalocyanines including polysubstituted phthalocyanines and metal-containing phthalocyanines, and merocyanines.

Sources of suitable infrared-absorbing dyes include H. W. Sands Corporation (Jupiter, Fla., US), American Cyanamid Co. (Wayne, N.J.), Cytec Industries (West Paterson, N.J.), Glendale Protective Technologies, Inc. (Lakeland, Fla.) and Hampford Research Inc. (Stratford, Conn.). Preferred dyes for LTHC and transfer layers are 3H-indolium, 2-[2-[2-chloro-3-[(1,3-dihydro-1,3,3-trimethyl-2H-indol-2-ylidene) ethylidene]-1-cyclopenten-1-yl]ethenyl]-1,3,3-trimethyl-, salt with trifluoromethanesulfonic acid (1:1) having CAS No. [128433-68-1] and molecular weight of about 619 grams per mole, available from Hampford Research Inc, Stratford, Conn., as TIC-5c; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1], available from H. W. Sands Corp, as SDA 4927; and indolenine dyes SDA 2860 and SDA 4733 from H. W. Sands Corp. SDA 4927 is an especially preferred dye for the LTHC layer.

An LTHC layer may include a particulate radiation absorber in a binder. Examples of suitable pigments include carbon black and graphite.

The weight percent of the radiation absorber in the LTHC layer, excluding the solvent in the calculation of weight percent, is generally from 1 wt % to 85 wt %, preferably from 3 wt % to 60 wt %, and most preferably from 5 wt % to 40 wt %, depending on the particular radiation absorber(s) and binder(s) used in the LTHC layer. Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, and styrene acrylics. The % transmittance of the LTHC layer is affected by the identity and amount of the radiation absorber, and the thickness of the LTHC layer. The LTHC layer should exhibit radiation transmission of about 20% to about 80%, more preferably of about 40% to about 50%, at the wavelength of the imaging radiation used in the thermal transfer imaging process. When a binder is present, the weight ratio of radiation absorber to binder is about 5:1 to about 1:1000 by weight, preferably about 2:1 to about 1:100 by weight. A polymeric or organic LTHC layer is coated to a thickness of 0.05 m to 20 m, preferably, 0.05 m to 10 m, and, more preferably, 0.1 m to 5 m.

In preferred embodiments of this invention, the LTHC layer is based upon a broad variety of water-soluble or water-dispersible polymeric binders with compositions as disclosed in the above referenced PCT/US05/38010 and PCT/US05/38009. Preferably, the average particle size of a water-dispersible binder in its aqueous phase is less than 0.1 micron, and more preferably less than 0.05 micron, and preferably having a narrow particle size distribution. Preferred water-soluble or water-dispersible polymeric binders for LTHC layers useful in the invention are those selected from the group: acrylic resins, and hydrophilic polyesters and more preferably from sulphonated polyesters as described in the above referenced PCT/US05/38009.

Other preferred polymeric binders for LTHC layers are maleic anhydride homopolymers and copolymers including those comprising functionality provided by treating the maleic anhydride polymers and/or copolymers with alcohols, amines, and alkali metal hydroxides. Preferred maleic anhydride based copolymers comprise the structure represented by formula (III)

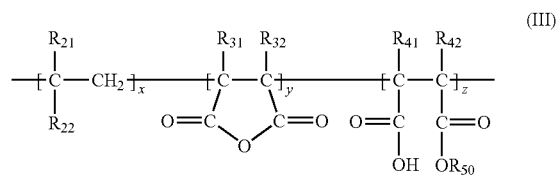

wherein x and z are any positive integer;
wherein y is zero or any positive integer;
$R_{21}$ and $R_{22}$ can be the same or different, and individually are hydrogen, alkyl, aryl, aralkyl, cycloalkyl, and halogen, provided that one of $R_{21}$ and $R_{22}$ is an aromatic group;
$R_{31}$, $R_{32}$, $R_{41}$ and $R_{42}$ are the same or different groups, which can be hydrogen or alkyl of one to about five carbon atoms; and
$R_{50}$ is functional group selected from:
 a) alkyl, aralkyl, alkyl-substituted aralkyl radicals containing from one to about twenty carbon atoms;
 b) oxyalkylated derivatives of alkyl, aralkyl, alkyl-substituted aralkyl radicals containing from about two to about four carbon atoms in each oxyalkylene group, which can be of one to about twenty repeating units;
 c) oxyalkylated derivatives of alkyl, aralkyl, alkyl-substituted aralkyl radicals containing from about two to about four carbon atoms in each oxyalkylene group, which can be of one to about six repeating units;
 d) at least one unsaturated moiety;
 e) at least one heteroatom moiety;
 f) alkaline molecules capable of forming salts selected from Li, Na, K and $NH_4^+$; and
 g) combinations thereof.

A preferred maleic anhydride polymer for LTHC layers comprises a copolymer of formula (III), wherein $R_{21}$, $R_{31}$, $R_{32}$, $R_{33}$, $R_{41}$, $R_{42}$, $R_{43}$, are individually hydrogen, $R_{22}$ is phenyl, and $R_{50}$ is 2-(n-butoxy)ethyl. A specific example of a maleic anhydride copolymer useful in LTHC layers is a styrene maleic anhydride copolymer such as SMA 1440H, a product of Sartomer Corporation, Exton, Pa.

In one embodiment of the invention, a preferred LTHC layer comprises one or more water-soluble or water-dispersible radiation-absorbing cyanine compound(s) selected from the group consisting of: indocyanines, phthalocyanines including polysubstituted phthalocyanines and metal-containing phthalocyanines, and merocyanines; and one or more water-soluble or water-dispersible polymeric binders selected from the group consisting of: acrylic resins, hydrophilic polyesters, sulphonated polyesters, and maleic anhydride homopolymers and copolymers.

A most preferred LTHC layer further comprises one or more release modifiers selected from the group consisting of: quaternary ammonium cationic compounds; phosphate anionic compounds; phosphonate anionic compounds; compounds comprising from one to five ester groups and from two to ten hydroxyl groups; alkoxylated amine compounds; and combinations thereof.

Metal radiation absorbers also may be used as LTHC layers, either in the form of particles or as films, as disclosed in U.S. Pat. No. 5,256,506 hereby incorporated by reference. Nickel and chromium are preferred metals for the LTHC layer 108, with chromium being especially preferred. Any other suitable metal for the heating layer can be used. The preferred thickness of the heating layer depends on the optical absorption of the metals used. For chromium, nickel/vanadium alloy or nickel, a layer of 80-100 Angstroms is preferred.

Preferred radiation absorbers for LTHC layers utilized herein are selected from the group: metal films selected from Cr and Ni; carbon black; graphite; and near infrared dyes with an absorption maxima of about 600 to 1200 nm within the LTHC layer.

Additional Transfer Layer

Figure 2A:
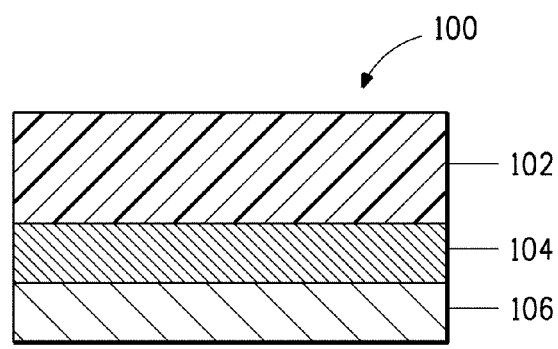
FIG. 2A is a cross-sectional view of a thermal imaging donor 100 comprising an additional transfer layer 104.

FIG. 2A is a cross-sectional view of a thermal imaging donor 100 in accordance with another embodiment of the invention. The thermal imaging donor 100 comprises base film 102, an additional transfer layer 104, and metal transfer layer 106 dispersed on the surface of layer 104.

Figure 2B:
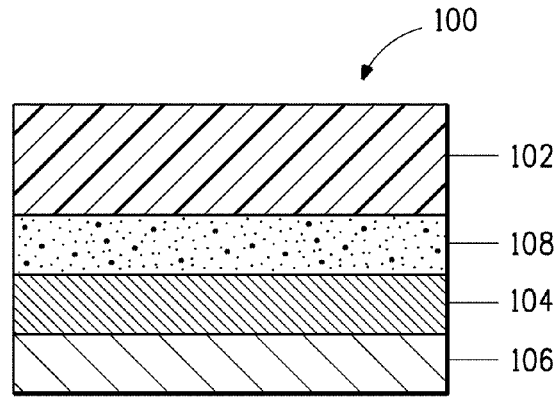
FIG. 2B is a cross-sectional view of a thermal imaging donor 100 comprising a LTHC layer 108 interposed between base film 102 and an additional transfer layer 104.

FIG. 2B is a cross-sectional view of thermal imaging donor 100, in accordance with another embodiment of the invention. The thermal imaging donor 100 comprises a LTHC layer 108 interposed between base film 102 and an additional transfer layer 104; and a metal transfer layer 106 on the additional transfer layer 104.

The thermal imaging donor may have one or more additional transfer layers disposed between the base film and the metal transfer layer, defined herein as below the metal transfer layer; or on a side of the metal transfer layer opposite said base film, herein defined as above the metal transfer layer. The additional transfer layer thickness can be anywhere from about 5 nm to about 5 μm, and more preferably, about 100 nm to about 3 μm. The additional transfer layer can be a functional layer, acting as a conducting, semiconducting, insulating, adhesive, planarizing, light attenuating or protective layer, for instance, and is transferred along with the metal transfer layer in the thermal transfer process. Following transfer, the additional transfer layer may lie on top of the patterned metal layer. Alternatively, if the additional transfer layer is on top of the metal layer in the donor, following transfer, it will lie between the receiver and the metal layer.

Conducting and Resistive Layers

Conductor and resistive layers, including polymers with or without various fillers, can be useful additional transfer layers. Useful conductive layers include Tr-conjugated organic polymers and doped versions of these polymers. Preferred polymers fall in one or more of the following categories: (a) stable conducting polymers such as polyaniline (PANI) and polyethylene dioxythiophene (PEDOT); (b) soluble or dispersable conducting polymers that form films using standard coating techniques, including PANI, PEDOT; and other alkyl- or alkoxy-substituted derivatives of conducting polymers such as poly(2,5 dialkoxy)paraphenylene vinylene and poly(3-hexyl)thiophene; and (c) conducting polymers that give high conductivity upon doping. Preferred conducting polymers, referred to herein as Conducting Polymers A, are selected from the group consisting of: polyaniline; polythiophene; polypyrrole; polyheteroaromatic vinylenes; and their derivatives. Descriptions of highly conductive polymers and methods for doping conductive polymers can be found in the following references: Bredas, J.-L. In *Handbook of Conducting Polymers*; Skotheim, T., Ed.; Marcel Dekker, Inc., New York, 1986, Vol. 2, Chapter 25; MacDiamid, A. G., *Angew. Chem. Int. Ed.* 2001, 40, 2581-2590; and Heeger, A. J. *Angew. Chem. Int. Ed.* 2001, 40, 2591-2611. U.S. Pat. Nos. 5,863,465 and 5,370,825 describe the conducting and semiconducting properties of polyanilines. Organic acids, including plasticizing acids, are preferred dopants. Additional preferred dopants are conducting nanoparticles selected from the group consisting of: gold; silver; copper; and alloys thereof; ITO; ATO; carbon nanotubes; and mixtures thereof.

In preferred embodiments of the invention, the conductivity of polyanilines and derivatives thereof can be fine-tuned with dopants including organic acids and, optionally, carbon nanotubes to provide appropriate levels of conductivity, as described in US 2005/0116202, hereby incorporated by reference. Preferred conductive additional transfer layers comprise polyaniline dispersions of single wall carbon nanotubes (SWNT), preferably about 0.1 to 12 wt % SWNTs. Preferably the polyaniline and derivatives thereof are further doped with an organic protonic acid having 1 to 30 carbons, the acid present at a mole equivalent amount of about 25% to about 100% of the nitrogen atoms in the polymer backbone. A preferred organic protonic acid is dinonylnaphthalene sulfonic acid (DNNSA).

The preferred thickness of conductors useful as additional transfer layers is about 0.01 to about 10 microns, preferably about 0.1 to about 5 microns, and more preferably about 0.2 to about 3 microns.

Conductive additional transfer layers can also include nonconducting polymers doped with conductive or resistive nanoparticles. Preferred nonconducting polymers useful in formulating conductive additional transfer layers are Nonconducting Polymers A, defined here as selected from the group consisting of: acrylic and styrenic-acrylic latexes and solution-based acrylic and styrenic-acrylic (co)polymers including random and graft copolymers and (meth)acrylate copolymers; and combinations thereof; copolymers of ethylene with one or more monomers selected from the group consisting of: (meth)acrylate(s), vinyl acetate, carbon monoxide and (meth)acrylic acid; and polyvinylacetate and its copolymers. Especially preferred solution-based and latex polymers of Nonconducting Polymers A have a Tg of about −50° C. to about 175° C., and more preferably, about −30° C. to about 90° C. Especially preferred solution-based polymers of this group are additionally characterized by a $M_w$ of about 10,000 to about 200,000. Additionally preferred nonconducting polymers, referred to herein as Nonconducting Polymers B, useful in forming conductive additional transfer layers are polyvinylpyrrolidone and its copolymers including polyvinylpyrrolidone-co-vinyl acetate. Preferred conducting nanoparticles as dopants are selected from the group consisting of: gold; silver; copper; and alloys thereof; ITO; ATO; carbon nanotubes; and mixtures thereof. Preferred doping is in the range of about 40 to about 90 wt % nanoparticles.

Dielectric Layers

Dielectric layers, including insulating polymers with or without various fillers, including pigments, can be useful additional transfer layers in the invention. Dielectric layers especially useful in devices include organic polymers and polymers combined with high K dielectric nanoparticles. Herein high K dielectric nanoparticles refers to nanoparticles with a dielectric constant of 20 and above, preferably 30 and above, and more preferably 100 and above.

In one embodiment of the invention, the additional transfer layer 104 is a dielectric layer having a resistivity of about $10^{14}$ ohm-cm or greater comprising at least one layer of material, herein referred to as Layer A, comprising: one or more dielectric polymers selected from the group consisting of: acrylic and styrenic polymers selected from the group consisting of: acrylic, styrenic and styrenic-acrylic latex, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate); and about 0.5 wt % to about 10 wt %, based on the dry weight of the Layer A, of one or more near-IR dye(s) characterized by an absorption maximum in the range of about 600 to about 1200 nm within Layer A. The term dielectric polymers herein encompasses homopolymers, copolymers derived from polymerization of two or more monomers, post-derivatized (co)polymers including graft (co)polymers, and low molecular weight homopolymers or copolymers. The polymers may be linear, branched, hyperbranched or dendritic.

Preferred dielectric polymers for Layer A include acrylic, styrenic and styrenic-acrylic latexes comprising alkyl (meth)acrylate, styrene, and alkyl-substituted styrene wherein the alkyl group is a C1 to C18 straight or branched chain alkyl group. Preferred optional monomers for these latex-based polymers include (meth)acrylic acid, hydroxyethyl (meth)acrylate and glycidyl (meth)acrylate. More preferred acrylic, styrenic and styrenic-acrylic latexes are selected from the group: Latexes A, defined herein as one or more latex resins comprising at least about 85 wt %, preferably at least about 90 wt %, and more preferably at least about 95 wt %, of monomers selected from the group: alkyl (meth)acrylate, styrene, and alkyl-substituted styrene wherein the alkyl group is a C1 to C18 straight or branched chain alkyl group. Preferred optional monomers for these latex resins include (meth)acrylic acid, preferably up to about 5 wt %, hydroxyethyl (meth)acrylate, preferably up to about 10 wt %, and glycidyl (meth)acrylate, preferably up to about 5 wt %. Preferably the latexes have an average particle size of less than about 150 nm, more preferably, less than about 100 nm, and an acid number less than about 100, preferably less than about 75, and more preferably less than about 25.

Particularly preferred polymers for Layer A with high resistivity (above $10^{14}$ ohm-cm) are Acrylic Latexes B and Styrene-Acrylic Latexes C and combinations thereof. Acrylic Latexes B are defined herein as one or more acrylic latexes comprising at least about 85 wt %, preferably at least about 90 wt %, and more preferably at least about 95 wt %, of monomers selected from the group consisting of: methyl methacrylate and butyl acrylate. Styrene-Acrylic Latexes C are defined herein as one or more styrene-acrylic latexes comprising at least about 85 wt %, preferably at least about 90 wt %, and more preferably at least about 95 wt %, of monomers selected from the group consisting of: methyl methacrylate, butyl acrylate and styrene. Preferred optional monomers for Acrylic Latexes B and Styrene-Acrylic Latexes C are selected from the group consisting of: (meth)acrylic acid, preferably up to about 5 wt %, hydroxyethyl methacrylate, preferably up to about 10 wt %, and glycidyl methacrylate, preferably up to about 5 wt %. Commercial examples of acrylic and styrenic acrylic latexes useful as dielectric polymers include Joncryl® 95 and 1915 (co)polymers (Johnson Polymer). Methods for synthesizing suitable latex polymers have been reported in WO 03/099574.

Further preferred dielectric polymers for Layer A include solution-based acrylic, styrenic and styrenic-acrylic polymers. Herein the term "solution-based" refers to materials that are soluble in solvents such as water and/or one or more common organic solvents including alcohols, e.g. ethanol and butoxyethanol; ethers, e.g. dimethoxyethane; esters, e.g. ethyl and butyl acetate; ketones, e.g., acetone and 2-butanone; and aromatic hydrocarbons, e.g. xylenes. Preferred solution-based acrylic, styrenic and styrenic-acrylic polymers have a $M_w$ of less than about 100,000, preferably less than 50,000, and more preferably less than 30,000. Furthermore, preferred solution-based acrylic, styrenic and styrenic-acrylic polymers have an acid number less than about 250. Preferred solution-based acrylic, styrenic and styrenic-acrylic polymers comprise monomers selected from the group: alkyl (meth)acrylate, benzyl (meth)acrylate, styrene, and alkyl-substituted styrene wherein the alkyl group is a C1 to C18 straight or branched chain alkyl group. Preferred optional monomers for these solution-based polymers include (meth)acrylic acid and hydroxyethyl (meth)acrylate.

A particularly preferred material for Layer A is a combination of the acrylic, styrenic and styrenic-acrylic latexes and water-based acrylic, styrenic and styrenic-acrylic polymers described above. Preferably the combination comprises about 20 wt % to about 80 wt %, more preferably about 40 wt % to about 80 wt %, of an acrylic or styrenic-acrylic latex fraction and about 20 wt % to about 80 wt %, more preferably about 20 wt % to about 60 wt %, of a water-based acrylic or styrenic-acrylic polymer fraction, based on the dry weight of the combination.

Other preferred dielectric polymers for Layer A include heteroatom-substituted styrenic polymers selected from the group consisting of: partially hydrogenated poly(4-hydroxy) styrene, poly(4-hydroxy)styrene (PHS), and copolymers of PHS with hydroxyethyl (meth)acrylate, alkyl (meth)acrylate, styrene, and alkyl-substituted styrene wherein the alkyl group is a C1 to C18 straight or branched chain alkyl group. Particularly preferred comonomers are hydroxyethyl methacrylate, butyl acrylate, methyl methacrylate and styrene with hydroxyethyl methacrylate and butyl acrylate being especially preferred. The PHS (co)polymers may be linear or branched. When PHS homopolymer is used, the branched structure is preferred Preferred (co)polymers of this class have a $M_w$ of less than about 30,000 and preferably less than about 20,000 and more preferably less than about 10,000. Partially hydrogenated PHS refers to PHS polymers that have been hydrogenated up to about 50 equivalent % of the unsaturation within the polymer and preferred polymers are hydrogenated to about 10 to 20 equivalent %. Commercial examples include PHS-B (branched PHS homopolymer; DuPont Electronic Technologies, Dallas, Tex.), Maruka Lyncur CMM (PHS copolymer with methyl methacrylate; Maruzen Petrochemical Co., LTD. Tokyo, Japan), Maruka Lyncur CHM (PHS copolymer with hydroxyethyl methacrylate; Maruzen), Maruka Lyncur CBA (PHS copolymer with butyl acrylate, Maruzen), Maruka Lyncur CST 15, 50, and 70 (PHS copolymers with styrene, Maruzen), and Maruka Lyncur PHM-C (partially hydrogenated PHS, Maruzen).

Other preferred dielectric polymers for Layer A include those selected from the group consisting of: phenol-aldehyde (co)polymers/(co)oligomers and combinations thereof. Preferred (co)polymers/(co)oligomers in this class are derived from mono- and bis-phenols and mono- and bis-aldehydes selected from the group consisting of: phenol; alkyl- and aryl-substituted phenols; formaldehyde; and alkyl-, aryl- and heteroatom-substituted aldehydes. The phenol-aldehyde resins can be further derivatized, e.g., the hydroxy group converted to an ether group. Preferred (co)polymers/(co)oligomers within this group have a $M_w$ of about 20,000 or less, preferably about 10,000 or less. Commercial examples include Novolac®/Novolak® resins (Schenectady International Inc., Schenectady N.Y.).

Other preferred dielectric polymers for Layer A include poly(vinyl acetate) homopolymer. Preferred polymers within this group have a $M_w$ of about 100,000 or less.

The above polymers may be plasticized for improved flexibility, adhesion, compatibilization with an IR dye, among other characteristics. In certain instances, the plasticizer may be selected from the above classes of polymers. For example, a higher Tg or higher molecular weight (MW) phenol-aldehyde polymer can be blended with a lower Tg or lower MW phenol-aldehyde polymer. Another example is PHS blended with a phenol-aldehyde polymer. Examples of suitable plasticizers for some of the above classes of polymers comprise poly(ethylene) glycol, glycerol ethoxylate, di(ethyleneglycol) dibenzoate, and phthalate-based plasticizers such as dibutyl phthalate. A number of potentially suitable plasticizers for various polymers and details regarding their use may be found in the following reference: "*Handbook of Plasticizers,*" Ed. G. Wypych, ChemTec Publishing, Toronto, Ont. 2004.

Layer A comprises about 0.5 wt % to about 10 wt %, and more preferably about 0.5 wt % to about 6 wt %, based on the dry weight of Layer A, of one or more near-IR dye(s) characterized by an absorption maxima in the range of about 600 to about 1200 nm within the Layer A. Preferably the near-IR dye is chosen such that its absorption band overlaps with the emission band of the exposure laser used in the transfer process. Typically, the exposure laser emits radiation in the near-IR range. Preferred classes of dyes are the cyanine compound(s) selected from the group: indocyanines, phthalocyanines including polysubstituted phthalocyanines and metal-containing phthalocyanines, and merocyanines. A particularly preferred class of near-IR dye(s) is that of indocyanine dyes having absorption at about 830 nm. A number of suitable indocyanine dyes absorbing at around 830 nm and with solubility in different solvents and in water are available from H. W. Sands Co. and other sources. Preferred near-IR dyes for the invention are selected from the group: 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1]; and indolenine dyes corresponding to formulas (I) and (II) and resonance structures thereof:

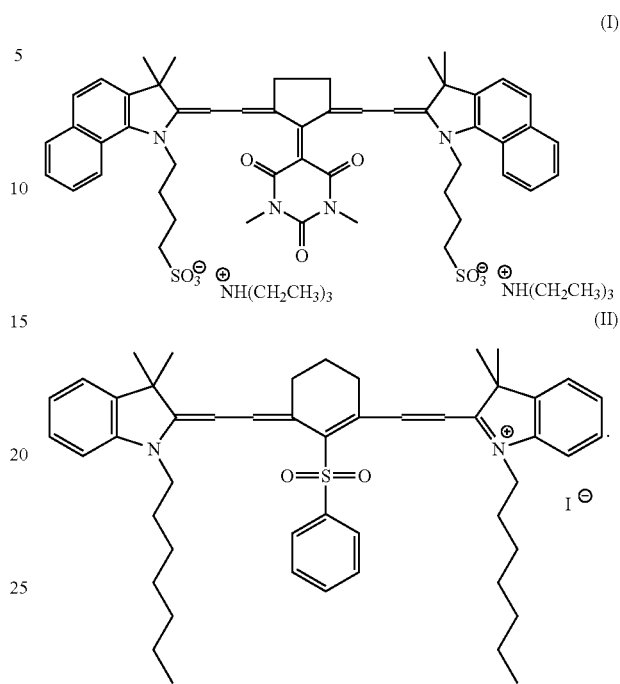

Preferred dye levels in the material will give a film OD of about 0.2 or greater, with an OD of about 0.5 to about 1.5 being preferred. To reach a preferred OD, unfilled water-based latex systems will typically require a higher dye loading of about 4 to 6 wt %. Unfilled solution-based systems will typically require lower dye loadings of about 0.5 to about 2 wt %.

In another preferred embodiment the dielectric layer comprises two or more Layers A that are gradient dye layers with each gradient dye layer independently characterized by a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.

In another preferred embodiment, the at least one Layer A further comprises a high κ nanoparticle fraction, of about 10 to about 90 wt % based on the dry weight of Layer A, with the nanoparticle fraction having a dielectric constant greater than about 20, and an average particle size of about 5 nm to about 500 nm. Herein high κ dielectric nanoparticle fraction refers to nanoparticles with a dielectric constant of about 20 and above, preferably about 30 and above, and more preferably about 100 and above. Preferred dielectric polymers for practicing this embodiment are selected from the group: acrylic and styrenic-acrylic latex, solution-based acrylic and styrenic-acrylic (co)polymers, and combinations thereof; and phenol-aldehyde (co)polymers/(co)oligomers; as described above. Preferred high κ dielectric nanoparticles for practicing this embodiment are selected from the group: barium titanate, strontium titanate, barium strontium titanate and titanium dioxide.

In another preferred embodiment the dielectric layer comprises two or more Layers A that are gradient nanoparticle layers with each gradient nanoparticle layer independently characterized by a dry wt % of high κ (high dielectric constant) nanoparticle fraction of about 10 to about 90 wt %; wherein at least one gradient nanoparticle layer has a lower wt % of high κ nanoparticle fraction and at least one gradient nanoparticle layer has a higher wt % of high κ nanoparticle fraction, and said higher wt % of high κ nanoparticle fraction is a value at least 20% higher than that of the lower wt %.

In another preferred embodiment the dielectric layer further comprises an additional dielectric layer, herein referred to as Layer B, comprising one or more dielectric polymers, characterized by a resistivity of about $10^{14}$ ohm-cm or greater. Extensive lists of dielectric polymers can be found in WO 03/052841 and WO 06/024012. Preferred dielectric polymers for Layer B are selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate), as described above. This embodiment can be further practiced including other embodiments disclosed above. Preferred optional additives for Layer B include carbon black and high κ nanoparticles with preferred high κ dielectric nanoparticles for practicing this embodiment selected from the group consisting of: barium titanate, strontium titanate, barium strontium titanate and titanium dioxide.

In another preferred embodiment the additional transfer layer has a resistivity of $10^{14}$ ohm-cm or greater and comprises at least one layer of material, herein referred to as Layer C, comprising one or more dielectric polymer(s) selected from the group consisting of: acrylic, styrenic and styrenic-acrylic latexes; comprising at least about 85 wt % of monomers selected from the group consisting of: alkyl (meth) acrylate, styrene, and alkyl-substituted styrene wherein the alkyl group is a C1 to C18 straight or branched chain alkyl group. This embodiment can be further practiced including other embodiments disclosed above. In one embodiment Layer C further comprises a high κ nanoparticle fraction, up to about 90 wt % of the dry weight of Layer C, with the nanoparticle fraction having a dielectric constant greater than about 20, and an average particle size of about 5 nm to about 500 nm. Preferred optional additives for Layer C include carbon black and high κ dielectric nanoparticles with preferred high κ dielectric nanoparticles for practicing this embodiment selected from the group: barium titanate, strontium titanate, barium strontium titanate and titanium dioxide.

The Tg's of the dielectric polymers utilized in Layer A, Layer B and Layer C range from about −30 to about 150° C., preferably about 20 to about 90° C. and most preferably about 30 to about 70° C. Typically, the addition of fillers enables the utilization of lower Tg polymers and the addition of plasticizers enables the utilization of higher Tg polymers. The preferred Tg of the dielectric layer itself and of the layers utilized in the dielectric layer, including Layer A, Layer B, and Layer C is about 30 to about 100° C., preferably about 40 to about 85° C. and most preferably about 45 to about 65° C.

Layer A, optional Layer B and Layer C may include additives such as fillers, surfactants, defoamers, dispersants and grinding aids. Numerous surfactants, defoamers, dispersants and grinding aids are available that are suitable for this purpose. Selection will often be based upon observed coating and dispersion quality and the desired adhesion of the dielectric layer to other layers in the thermal transfer process. In certain embodiments, the surfactants comprise siloxy-, fluoryl-, alkyl- and alkynyl-substituted surfactants. These include the Byk® (Byk Chemie), Zonyl® (DuPont), Triton® (Dow), Surfynol® (Air Products) and Dynol® (Air Products) surfactants. Preferred are Byk® 345, 346 and 348 and Zonyl® FSO and FSN surfactants. In certain embodiments, the defoamers comprise alkyl and alkynyl functionality and include Surfynol® defoamers. In certain embodiments, the dispersants comprise functionalized polymers, oligomers and monomers and include Surfynol® and Disperbyk® dispersants.

The preferred thickness of the dielectric layer and of the layers utilized in the dielectric layer, including Layer A, Layer B and Layer C, is about 0.05 to about 10 microns, preferably about 0.1 to about 5 microns, and more preferably about 0.2 to about 3 microns.

Dielectric polymers filled with light-absorbing pigments make useful additional transfer layers. Such layers are particularly useful when used below or on top of a metal transfer layer such as silver. A preferred pigment for this purpose is carbon black. Preferred compositions are about 1 wt % to about 90 wt % carbon black.

Preparation of the Thermal Imaging Donor

The thermal imaging donor comprising a metal transfer layer is prepared by applying the fluid dispersion of the metal composition onto the surface of the thermal imaging substrate and volatizing the carrier fluid. Applying the fluid dispersion can be accomplished by any method that gives a uniform layer, or if desired, a patterned or nonuniform metal transfer layer. Coating, including rod coating and spin-coating, spraying, printing, blading or knifing can be used. Coating and spraying are preferred methods for applying the fluid dispersion to provide uniform metal transfer layers. The carrier fluid is allowed to evaporate to provide the metal transfer layer or the layer can be dried by any conventional method of drying including applying heat and/or vacuum.

Figure 3A:
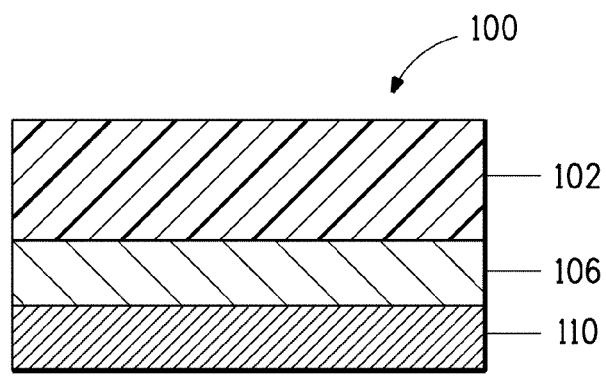
FIGS. 3A, 3B and 3C are cross-sectional views of a thermal imaging donor 100 comprising an additional transfer layer 110 on top of the metal transfer layer 106.
Figure 3B:
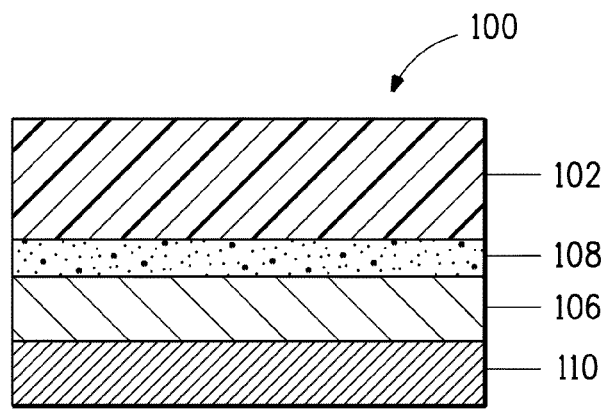
Figure 3C:
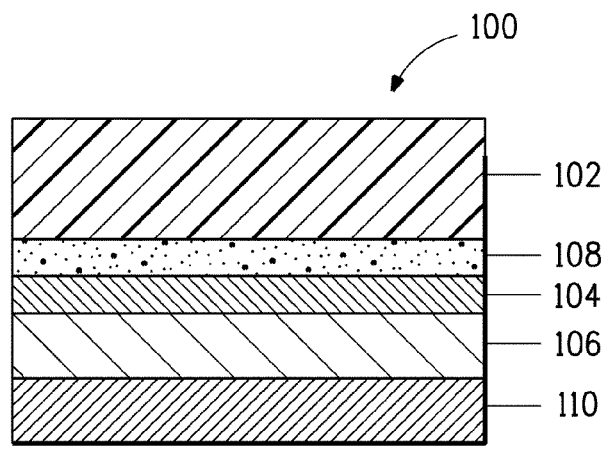

The thermal imaging donor optionally can comprise one or more additional transfer layers deposed on top of, or below, the metal transfer layer. FIG. 3A is a cross-sectional view of a thermal imaging donor 100 in accordance with another embodiment of the invention. The thermal imaging donor 100 comprises base film 102, metal transfer layer 106 and an additional transfer layer 110 on top of the metal transfer layer. FIG. 3B is a cross-sectional view of a related thermal imaging donor 100 further including a LTHC layer 108 interposed between base film 102 and the metal transfer layer 106. FIG. 3C is a cross-sectional view of a related thermal imaging donor 100, wherein an additional transfer layer 104, is interposed between the LTHC layer 108 and metal transfer layer 106, and an additional transfer layer 110 is on top of the metal transfer layer.

A particularly preferred embodiment of the invention includes an additional transfer layer that is a light attenuating layer. Light attenuating layers can be used to minimize the visibility of the metal transfer layer in the final electronic device, and can be deposed on either side or both sides of the metal transfer layer as an additional transfer layer. Preferably the light attenuating layer is comprised of the preferred dielectric materials discussed above and a visible light absorbing dye or pigment. A preferred pigment is carbon black.

Optionally, a protective strippable cover sheet may be present on the outmost layer of the thermal transfer donor. The cover sheet protects the underlaying transfer layers and is easily removable.

Thermal Imaging Receiver

Figure 4:
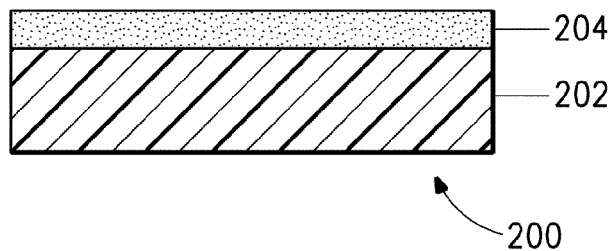
FIG. 4 is a cross-sectional view of a thermal imaging receiver 200 comprising a receiver base film 202 and optional adhesive layer 204.

FIG. 4 is a cross-sectional view of thermal imaging receiver 200, in accordance with one embodiment of the invention, including a receiver base film 202 and optional adhesive layer 204. The receiver base film 202 is a dimensionally stable sheet material as defined for the base film of the thermal imaging donor. Additionally, the receiver base film can be an opaque material, such as polyethylene terephthalate filled with a white pigment such as titanium dioxide; ivory paper; or synthetic paper, such as Tyvek® spunbonded polyolefin. The sheet material can also be glass. Preferred base films for receivers are polyethylene terephthalate, polyethylene naphthalate, polyimide (Kapton®) and glass.

The optional adhesive layer 204 facilitates adhesion of the thermal imaging receiver 200 to the thermally imaged transfer layer. Suitable adhesive layers 204 comprise any of the (co)polymers/co(oligomers)/resins mentioned above in the description of the additional transfer layer. Preferred image receiving layers herein are Acrylic Latexes A, as defined above.

Patterned Multilayer Compositions

The various embodiments of thermal imaging donors and receivers defined above are useful in providing a patterned multilayer composition, also of the invention, comprising: (a) one or more base film(s); and (b) one or more patterned metal layer(s); wherein the patterned metal layer(s) has a pattern comprising at least one line of width of about 1 millimeter or less, and comprises the metal composition (A), as disclosed above. Preferably the patterned metal layer has at least at least one line of width of about 200 microns or less. In other embodiments the patterned metal layer has at least one line of width of about 150 microns or less, 100 microns or less, 50 microns or less, 20 microns or less and 10 microns or less. Preferably the multilayer composition has a resistivity of about $10^{-2}$ ohm-cm or less and preferably about $10^{-4}$ ohm-cm or less.

The patterned multilayer compositions can further include additional patterned layers disposed between said base film and the patterned metal layer, herein defined as below the patterned metal layer; or on a side of the patterned metal film opposite said base film, herein defined as above the patterned metal layer. The additional patterned layers, and their preferred embodiments, correspond to those materials and layers disclosed above as useful and preferable for additional transfer layers.

The patterned multilayer composition is useful as electronic circuits for electronic devices such as thin film transistors, displays, and touch pads. In a preferred application the patterned multilayer composition is useful as an electromagnetic interference (EMI) shield that may be used to shield electronic devices from outside radiation, and shield the local environment from radiation emitting from the device. A typical example of a device is a plasma display panel (PDP) which generates a large amount of electromagnetic radiation. Usually, a front panel is disposed in front of the PDP to shield electromagnetic radiation. The front panel must have a shielding function of 30 decibel (dB) or above in the range of 30 MHz to about 1 GHz to shield electromagnetic radiation emitted from the screen of the display. This is usually accomplished with a very thin pattern of metal mesh mounted on a transparent base film. The metal mesh (lines) of the EMI shield should not deteriorate visibility and should have a proper transparency. Typically the metal mesh is provided by a photolithographic process, as described, for instance, in US patent application 2006/0088690 A1

Base films useful in EMI shields include transparent inorganic compounds such as glass or transparent polymers such as acrylic or polycarbonate. Specific examples include PET, polysulfone, polyethersulfone, polystyrene, polyethylene naphthalate, polyacrylate, polyetherketone, polycarbonate, polypropylene, polymethyl methacrylate. Preferred base films for EMI shields of the invention are selected from the group consisting of: polyethylene terephthalate, polyethylene naphthalate, triacetyl cellulose and glass.

Another embodiment of the invention is the electromagnetic shield described above, further comprising an additional patterned layer disposed below the patterned metal layer, or above the patterned metal layer. Preferably this additional patterned layer is a light-attenuating layer; and most preferably the additional patterned layer comprises about 1 to about 90 wt % carbon black.

Preferably the EMI shield further comprises an antireflection layer on a surface, on the viewing side, of the base film. An antireflection film is generally disposed on an outermost surface of an image display device such as an optical lens, cathode ray tube display device (CRT), plasma display panel (PDP), liquid crystal display device (LCD), or organic electroluminescent device, to reduce reflectance so as to prevent optical interference from external light. There are various commercially available single-layer and multiple-layer antireflection films. A multiple-layer antireflection film consists of alternate high-diffraction and low-diffraction layers. Suitable high-diffraction layers are those of niobium oxide, titanium oxide, zirconium oxide and ITO. Suitable low-diffraction layers are those of silicon oxide, magnesium fluoride and such. Some antireflection film has a layer having a minutely roughened surface that reflects external light in a diffused reflection mode. For a general reference on antireflective materials and coatings, see: Dobrowolski, J. A. In *Handbook of Optics*; Bass, M. Ed.; McGraw-Hill, Inc.: New York, 1995; Vol. 1, Chapter 42.

Another embodiment of the invention is a touchpad sensor comprising a multilayer composition having a patterned metal layer as described above. Preferably the touchpad sensor comprises a dielectric layer as disclosed in the section entitled "Dielectric layers" above. In one embodiment the touchpad sensor comprises a first base film with a first patterned metal layer; a second base film with a second patterned metal layer; and a dielectric layer deposed between the first and second patterned metal layers. In another embodiment the touchpad sensor comprises a first base film, having two opposing surfaces, a patterned metal layer deposed on each of the two opposing surfaces; and a dielectric layer on top of each of the patterned metal layers.

Thermal Transfer to Provide Patterned Multilayer Compositions

To provide patterned multilayer compositions the thermal imaging donor is contacted with a thermal imaging receiver. By contacted is meant that the donor is in close proximity, preferably within several microns, of the receiver. The receiver may be off-set from the donor by, for example, previously printed layers, fibers or particles that act as spacers to provide a controlled gap between donor and receiver. Vacuum and/or pressure can be used to hold the donor element 100 and the receiver element 200 together. As one alternative, the donor element 100 and the receiver element 200 can be held together by fusion of layers at the periphery of the assembly.

At least a portion of the metal transfer layer, and optionally a portion of one or more additional transfer layers, is transferred to the thermal imaging receiver by thermal transfer to form a patterned metal layer. Thermal transfer can be achieved by a laser-mediated transfer process. In one embodiment, the assembly of the donor element 100 and the receiver element 200 is selectively exposed to heat, which is preferably in the form of laser radiation, in an exposure pattern of the image of the desired pattern to be formed on the substrate. The laser radiation is focused about at the interface between those layers to be transferred and those to remain with the donor. For instance, if an LTHC layer is present the laser is focused on the interface between the LTHC layer and the metal layer. Sufficient radiation is applied to achieve transfer of the desired transfer layers to the receiver.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Other light sources and irradiation conditions can be suitable based on, among other things, the donor element construction, the transfer layer material, the mode of thermal transfer, and other such factors.

The radiation is preferably applied through the backside of base film 102, that is, the side not containing the metal transfer layer. Laser radiation preferably is provided at a laser fluence of up to about 600 mJ/cm$^2$, and more preferably about 75-440 mJ/cm$^2$. Various types of lasers can be used. The laser preferably emits in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.). Other types of lasers and lasers, which emit in other wavelength bands, may be used as well. One device used for applying an image to the receiver is the Creo Spectrum Trendsetter 3244F, which utilizes lasers emitting near 830 nm. This device utilizes a Spatial Light Modulator to split and modulate the 5-50 Watt output from the ~830 nm laser diode array. Associated optics focus this light onto the imageable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fiber-coupled lasers emitting 500-3000 mW and each individually modulated and focused on the media. Such a laser can be obtained from Opto Power in Tucson, Ariz.

Figure 5A:
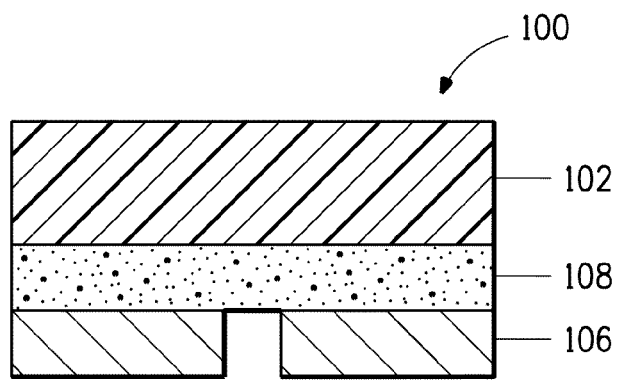
FIGS. 5A and 5B are cross-sectional views of a patterned multilayer composition.
Figure 5B:
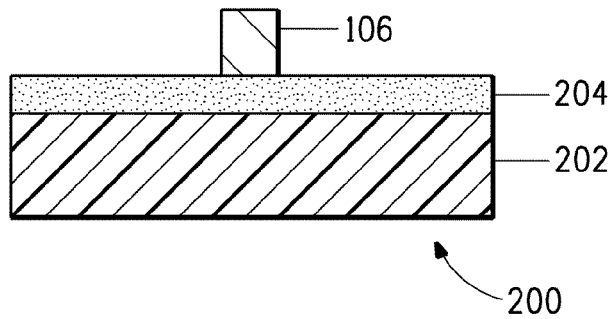
Figure 6A:
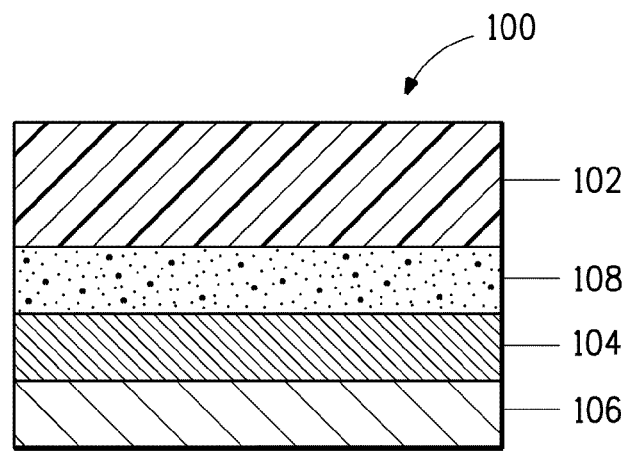
FIGS. 6A and 6B are cross-sectional views of a patterned multilayer composition comprising an additional transfer layer.
Figure 6B:
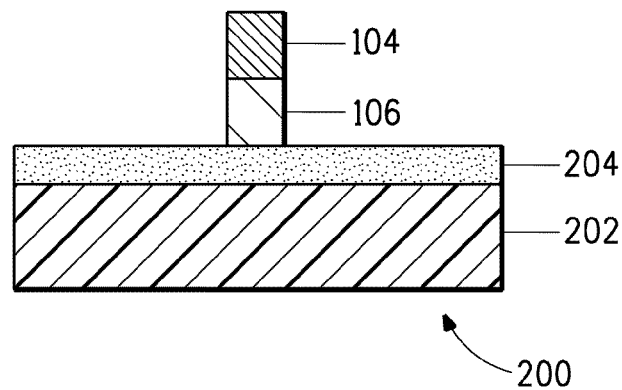
Figure 7:
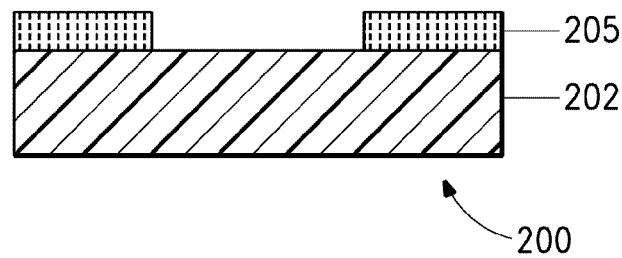
FIG. 7 is a cross-sectional view of a thermal imaging receiver 200 comprising a base film 202 and at least one patterned layer 205.

After exposure, the donor element 100 and the receiver element 200 are separated, as illustrated in FIGS. 5A and 5B, leaving the untransferred portions of the metal transfer layer 106 on the donor element 100 and the patterned metal transfer layer 106 on the receiver element 200. FIGS. 6A and 6B illustrate the embodiment wherein an additional transfer layer 104 is transferred along with the metal transfer layer to the receiver 200. FIG. 7 is a cross-sectional view of an alternative thermal imaging receiver 200 comprising a base film 202 and at least one patterned layer 205. Patterned layer 205 can be selected from a group consisting of patterned semiconductor layers, patterned conductor layers and patterned dielectric layers.

The patterned multilayer composition can be provided by the spent donor element (a negative of the image), the imaged receiver element (a positive of the image), or both elements. Furthermore, either or both of the spent donor element and the imaged receiver element may be utilized as the permanent substrate or the image may be transferred from the spent donor or receiver, preferably by lamination, to the permanent substrate.

Usually the transferred portions of the transfer layers correspond to those portions of the transfer layers exposed to laser radiation. In some instances, depending upon the nature of the donor and receiver elements and the transfer processing parameters, when the donor element 100 and the receiver element 200 are separated, the receiver element includes both exposed portions and non-exposed portions of one or more transfer layers. A process for enhancing the resolution of a pattern on a thermal imaging receiver comprising an exposed portion and a non-exposed portion of one or more thermal transfer layers on a surface of the thermal imaging receiver comprises: (a) contacting said surface of the thermal imaging receiver with an adhesive surface to provide a temporary laminate; and (b) removing said adhesive surface from the temporary laminate to provide a thermal imaging receiver with a surface substantially free of said non-exposed portion of one or more transfer layers. Suitable adhesive surfaces for performing the process are commercial adhesive tapes, for instance, those Scotch® brand tapes available from 3M company. Tacky rollers, for instance, a medium tack roller available in the form of a Dust Removal System-1 (red) from SDI (Systems Division, Inc., Irvine, Calif. 92618-2005) are a suitable adhesive surface for the process. Chrome films, used as LTHC layers described above, also make useful low tack adhesive layers for removing non-exposed portions of the transfer layers under very gentle conditions.

Various electrical elements that can be formed, at least in part, by the use of the present invention include electronic circuitry, resistors, capacitors, diodes, rectifiers, electroluminescent lamps, memory elements, field effect transistors, bipolar transistors, unijunction transistors, thin film transistors, metal-insulator-semiconductor stacks, organic transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), splitters, couplers, combiners, modulators, sensors (e.g., evanescent sensors, phase modulation sensors, interferometric sensors, and the like), optical cavities, piezo-electric devices, ferroelectric devices, thin film batteries, or combinations thereof; for example, the combination of field effect transistors and organic electroluminescent lamps as an active matrix array for an optical display.

Materials

Unless otherwise indicated, chemicals were used as received without further purification. Polymers, plasticizers, IR dyes, and surfactants were obtained from the sources listed in the specification or purchased from Aldrich. Pigments such as carbon black dispersions were obtained from Penn Color, Inc., Doylestown, Pa. Silver nanoparticles were purchased from Ferro Co.—Electronic Material Systems; Nanostructured & Amorphous Materials, Inc., and Mitsui Co. HiPco Raw CNt's were purchased form Carbon Nanotechnologies, Inc., Houston Tex.

Donor Substrates

Cr LTHC Layer. A base film of polyethylene terepthalate (PET, 50 microns thick in all examples unless stated otherwise) was coated with chrome metal in a vacuum deposition chamber by CP Films of Martinsville, Va. Metallization was carried out on PET films with and without light attenuating agents (670 nm absorbers). The chrome layer was coated at both 50% T and 40% T. In the examples, these donor films will be referred to as: 40% T Cr PET donor substrate and as 50% T Cr PET donor substrate; for the metallized films without light attenuating agents. The donor films with 670 nm absorbers incorporated in the base film will be referred to as: 40% T Cr Blue PET donor substrate and as 50% T Cr Blue PET donor substrate.

Organic LTHC Layer. The organic LTHC layer was prepared as reported in Formulation L of the Examples of PCT/US05/38009, referenced above:

A LTHC coating formulation was prepared from the following materials: (i) demineralised water: 894 g; (ii) dimethylaminoethanol: 5 g; (iii) Hampford dye 822 (Hampford Research; formula corresponds to SDA 4927): 10 g; (iv) polyester binder (Amertech Polyester Clear; American Inks and Coatings Corp; Valley Forge; Pa.): 65 g of a 30% aqueous solution; (v) TegoWet™ 251(4) (a polyether modified polysiloxane copolymer, Goldschmidt): 2.5 g; (vi) potassium dimethylaminoethanol ethyl phosphate: 14 g of an 11.5% aqueous solution [The 11.5% aqueous solution was prepared by combining three parts water and 0.5 parts ethyl acid phosphate (Stauffer Chemical Company, Westport, Conn.: Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water-free compound.]; (vii) crosslinker Cymel™ 350 (a highly methylated, monomeric melamine formaldehyde resin, Cytec Industries Inc. West Paterson, N.J.): 10 g of a 20% solution; and (viii) ammonium p-toluene sulphonic acid: 2 g of a 10% aqueous solution.

Ingredients (ii) and (iii) were added to the water and allowed to stir for up to 24 hours before addition of the other ingredients in the order shown. There was no need to filter this formulation. The formulation was applied in an in-line coating technique as follows: A PET base film composition was melt-extruded, cast onto a cooled rotating drum and stretched in the direction of extrusion to approximately 3 times its original dimensions at a temperature of 75° C. The cooled stretched film was then coated on one side with the LTHC coating composition to give a wet coating thickness of approximately 20 to 30 μm. A direct gravure coating system was used to apply the coatings to the film web. A 60QCH gravure roll (supplied by Pamarco) rotates through the solution, taking solution onto the gravure roll surface. The gravure roll rotates in the opposite direction to the film web and applies the coating to the web at one point of contact. The coated film was passed into a stenter oven at a temperature of 100-110° C. where the film was dried and stretched in the sideways direction to approximately 3 times its original dimensions. The biaxially stretched coated film was heat-set at a temperature of about 190° C. by conventional means. The coated polyester film is then wound onto a roll. The total thickness of the final film was 50 μm; the dry thickness of the transfer-assist coating layer is of 0.07 μm. The PET base film contained either Disperse Blue 60 or Solvent Green 28 dye to give a final dye concentration of typically 0.2% to 0.5% by weight in the polymer of the base film. The base film containing the Disperse Blue 60 dye (0.26% by weight) had an absorbance of 0.6±0.1 at 670 nm, and an absorbance of <0.08 at 830 nm. The base film containing the Solvent Green 28 dye (0.40% by weight) had an absorbance of 1.2 at 670 nm, and an absorbance of <0.08 at 830 nm. These donor substrates will herein be referred to as: Organic LTHC Blue PET donor substrate and Organic LTHC Green PET donor substrate.

Conductor Electrical Characterization

The sheet resistance and resistivity of conducting lines were obtained by measuring the resistance of lines with known geometries. A Cascade MicroTech (Beaverton, Oreg.) probestation model Alessi REL-6100 and a semiconductor parameter analyzer Agilent Technologies (Palo Alto, Calif.) model 4155C were used to apply a current across the lines and measure voltage drops at two known positions within the line. Typically, currents were swept from $1 \times 10^{-5}$ to $-1 \times 10^{-5}$ A to obtain voltages in the mV to V range. The slope of the I-V curve and the line geometry were used to obtain resistance, sheet resistance and resistivity. From these values conductivity and conductance can be calculated.

The present invention is further defined in the following Examples. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

Example 1

This illustrates formulation of a 90 wt % silver nanoparticle-dispersant composition used in this invention. A mixture of Ag powder (22.530 g, particle size d50=220 nm and d90=430 nm), 20% Elvacite® 2028 (12.550 g, 20 wt % in xylenes made from Elvacite® 2028, Lucite International, Inc.), xylenes (12.516 g) and di(ethylene glycol) dibenzoate (0.048 g) was treated with a sonication probe (Dukane Co. Model 40TP200, Transducer Model 41C28) for 15 min, during which time the mixture was stirred with a spatula at 5 min intervals. The container with the mixture was placed in a water bath with sonication for 1 h, during which time the mixture was stirred with a spatula at 0.5-h intervals. The mixture was then treated in a water bath at RT with probe sonication for additional 15 min, during which time the mixture was stirred gently with a spatula at 5-minute intervals. The resulting dispersion was filtered twice with 2.0 Whatman® MGF-150 syringe-disc filter (Whatman Inc., Clifton, N.J.).

Examples 2-15

Further examples 2-4, 6, 10-11, and 13-15, listed in Table 1 were prepared in a similar fashion with the following exceptions: in Example 3 the dispersion was filtered with 1.0 Whatman® MGF-150 syringe-disc filter; in Example 4 the dispersion was filtered through 12 and 8 stainless steel screens (Twill Dutch Weave, mesh count 200×1400 and 325×2300, absolute filter rating: 12-14 and 8 microns, Sefar America Inc., Depew, N.Y.); in Example 6 water was the solvent; in Example 10 methanol was the solvent; and in Example 11 isopropanol was the solvent.

Further Examples 5, 7-9 and 12 were prepared in a similar fashion to Example 1 except that there was no first 15 min probe sonication and the dispersions were treated in a water bath at RT with sonication for 2 hour (vs 1 hour), followed with a sonication probe for 10 min, during which time the mixtures were stirred gently with a spatula at 2-3 min intervals. The resulting dispersions were filtered with 2.0μ Whatman® MGF-150 syringe-disc filters with these exceptions: in Example 9 no filtration was used; in Example 12 filtration used 12μ screen; in Example 7 water was the solvent; and in Example 12, CNT was pre-dispersed with sonication probe for 15 min.

TABLE 1

Metal compositions of the invention.

| | | Metal Powder | | Dispersant | | | Additives | |
|---|---|---|---|---|---|---|---|---|
| Ex. No. | M/Loading % | d50/d90 (nm) | Wt. (g) | ID | Wt % | Dry wt (g) | ID | Dry wt. (g) |
| 1 | Ag/90 | 220/430 | 22.550 | Elvacite ® 2028 | 20 | 2.510 | A | 0.048 |
| 2 | Ag/89 | 350/730 | 20.028 | Elvacite ® 2028 | 20 | 2.478 | A | 0.050 |
| 3 | Ag/87.5 | 340/550 | 11.795 | Elvacite ® 2028 | 20 | 1.691 | — | — |
| 4 | Ag/94 | 870/1780 F | 18.802 | Elvacite ® 2028 | 20 | 1.201 | A | 0.020 |
| 5 | Ag/87.5 | 220/430 | 10.504 | Elvacite ® 4069 | 20 | 1.501 | — | — |
| 6 | Ag/87.5 | 220/430 | 21.874 | Joncryl ® 538/647 | 45/20 | 2.501/ 0.641 | B | 0.436 |
| 7 | Ag/85 | 220/430 | 5.432 | Joncryl ® 63 | 30 | 0.965 | B | 0.131 |
| 8 | Ag/93 | 220/430 | 8.932 | Elvaloy ® HP771 | 10 | 0.672 | — | — |
| 9 | Ag/90 | 220/430 | 4.390 | Elvax ® 200W | 5 | 0.488 | — | — |
| 10 | Ag/89 | 220/430 | 17.800 | PVP | 20 | 2.510 | — | — |
| 11 | Ag/89 | 220/430 | 17.790 | PVP-PVA | 20 | 2.510 | — | — |
| 12 | Ag/87.5 | 350/730 | 10.507 | Elvacite ® 2028 | 20 | 1.501 | C, D | 0.009, 0.013 |
| 13 | Ag/90 | 220/430 | 22.503 | Elvacite ® 2028 | 20 | 2.501 | A, C | 0.060, 0.072 |
| 14 | Ag/89 | 350/730 | 10.018 | Elvacite ® 2028 | 20 | 1.242 | A | 0.029 |
| 15 | Ag/89 | 350/730 | 20.026 | Elvacite ® 2028 | 20 | 2.477 | A, E | 0.057, 0.043 |

PVP = polyvinylpyrrolidone; PVP-PVA = poly(vinylpyrrolidone-vinylacetate);
F = equivalent spherical diameter of flake.
Additives: A = di(ethylenegylcol)dibenzoate;
B = Zonyl ® FSA;
C = Disperbyk ® 163;
D = carbon nanotubes;
E = SDA 4733 IR dye.

Donor Preparation

Coating of transfer and other layers onto donor and receiver elements was carried out utilizing stainless steel wrapped and formed 0.5 inch diameter coating rods (R.D. Specialties, Inc., Webster, N.Y.) and chrome-plated stainless steel formed 0.625 inch diameter rods with a CN profile (Buschman Corporation, Cleveland, Ohio). The donor free surface was cleaned with a pressurized nitrogen stream immediately prior to coating to rid the surface of particle contamination. The coatings were drawn by hand on a smooth glass surface or machine-coated utilizing a WaterProof® Color Versatility coating system (E.I. DuPont De Nemours, Inc., Wilmington, Del.).

Donors were stored in a controlled temperature/humidity environment with an average temperature of about 68° F. and about 40-50% average relative humidity.

The dispersions from Example 1, 5, and 7-12 were coated onto 40% T Cr PET substrates and dried at about 40° C. for 20 min.

The dispersions from Examples 2, 3 and 13 were coated onto organic LTHC Blue PET donor substrates and dried at about 43° C. for 20 min. The dispersions from Examples 4, 6 and 15 were coated on organic LTHC Green PET donor substrate and dried at about 45° C. for 20 min. The dispersion from Example 14 was coated on Melinex® 453 and dried at 46° C. for 20 min.

General Procedure for the Preparation of Aqueous Transfer Layers

A water solution was prepared by combining the specified amounts of water and, optionally, a 3 wt % ammonium hydroxide solution. Next, the IR dye, one-fourth of the water solution, and optional defoamers, surfactants and plasticizers were combined in a brown glass container and mixed well. The optional second binder was weighed in a container together with one-fourth of the water solution and mixed well. Optional pigment(s) were weighed in another container with one-fourth of the water solution and mixed well. Optional crosslinker(s) were weighed in another container with one-fourth of the water solution and mixed well. The binder was weighed in a large container with a stir bar and any remaining water solution was added. The contents of the second binder dispersion, the IR dye dispersion, the pigment dispersion and the crosslinker dispersion were slowly added to the stirring binder. After stirring for at least 15 additional minutes, the formulation was filtered into a brown or foiled-coated container. Syringe filters with 0.45 micron pore size were used unless specified otherwise (25 mm GD/X Glass Microfiber GMF with Propylene Housing; Cat. No. 6894-2504 Whatman, Whatman Inc., Clifton, N.J.).

Example 16

This example illustrates the preparation of a donor of the invention wherein the metal composition of Example 1 was applied to a thermal imaging substrate comprising a base film, an organic LTHC layer and a black acrylic latex carrier layer A black transfer layer formulation was prepared, following the general procedure described above, using 11.18 g of Joncryl 538 (45 wt %), 0.025 g of SDA 2860, 0.050 g of Byk® 348, 1.820 g of Carbon Black Acroverse Paste 32B56 (33 wt %; Penn Color), and 18.72 g of water to give a formulation with a pH of 9.10. The resulting solution was coated onto the Organic LTHC-Green PET donor substrate with a CN#2 formed Buschman rod at 9.8 ft/min and dried at 45° C. for 6 minutes. The wt % solids of the final dry coating was: 88.2 wt % Joncryl 538, 0.4 wt % SDA 2860, 0.9 wt % Byk 348, and 10.5 wt % Black 32B56.

The dispersion from example 1 was coated onto the black carrier layer at a speed of 5.8 ft/min with #6 CN formed Buschman rod and dried at 42° C. for 20 minutes.

Sheet resistance was measured according to the standard procedure given above. RSH<1 ohm/sq was measured for lines printed at drumspeed 40 at 7.25 W and above.

Example 17

This example illustrates the preparation of a donor of the invention wherein the metal composition of Example 1 was applied to a thermal imaging substrate comprising a base film, a chrome LTHC layer and a black soluble acrylic carrier layer, and transferred to a thermal imaging receiver.

A black carrier layer formulation was prepared using 14.14 g of Joncryl® 63 (30 wt %), 0.025 g of SDA 2860, 0.50 g of Byk® 348 (10 wt %), 2.70 g of Carbon Black Acroverse Paste 32B56 (33 wt %; Penn Color), 2.50 g of glycerol ethoxylate (20 wt %), and 11.94 g of water to give a formulation with a pH of 8.96. The resulting solution was coated onto a 40% T Cr Blue PET donor substrate (~35 by 20.5 cm) with a CN#2 formed Buschman rod at 9.8 ft/min and dried at 45° C. for 6 min. The wt % solids of the final dry coating was: 74.32 wt % Joncryl 63, 0.4 wt % SDA 2860, 0.9 wt % Byk® 348, 15.6 wt % Black 32B56 and 8.8 wt % glycerol ethoxylate.

The dispersion from Example 1 was coated onto the black carrier layer at a speed of 5.8 ft/min with a #6 CN formed Buschman rod and dried at 42° C. for 20 min.

Example 18-21

Thermal Imaging Equipment and Donor Mounting

Creo Trendsetter® 800 (Creo/Kodak, Vancouver, Canada) was utilized. The Creo Trendsetter® 800 was a modified drum-type imager utilizing a modified Thermal 1.7 Head with a 12.5 watt maximum average operating power at a wavelength of 830 nm with 5080 dpi resolution. The 800 Trendsetter was operated in a controlled temperature/humidity environment with an average temperature of ~68° C. and an average relative humidity of ~40-50%. For each printing experiment, a section of thermal imaging receiver was positioned on the drum. The thermal imaging donor was loaded so that the side of the donor element coated with the transfer layer was facing the free side of the receiver. Imaging assemblages were exposed from the back side through the donor film base. Films were mounted using vacuum hold down to a standard plastic or metal carrier plate clamped mechanically to the drum. In some experiments utilizing the Creo Trendsetter® 800 thermal platesetter, a nonstandard drum with vacuum holes machined directly onto the drum to match common donor and receiver sizes was used as a replacement for the standard drum/carrier plate assemblage. Contact between the donor and receiver was established by ~600 mm of Hg vacuum pressure. Laser output was under computer control to build up the desired image pattern. Laser power and drum speed were controllable and were adjusted in an iterative fashion to optimize image quality as judged by visual inspection of the transferred image on the receiving surface.

The Examples illustrates printing of the donor onto receiver of the invention. A section of thermal imaging receiver (Melinex® ST 504 film, DuPont Teijin Film) was loaded into a Creo Trendsetter® 800 thermal platesetter. Subsequently, a thermal-imaging donor fashioned as described above using the composition of example 1 was loaded so that the Ag coated side of the donor was facing the receiver. Contact between the donor and receiver was established by 600 mm of Hg vacuum pressure. Using the Creo Trendsetter® 800 thermal platesetter a conductor pattern was imaged. The donor element was imaged at 8.7, 8.8, 8.9, 10.5, 11.0 and 11.5 W, surface depth at 60 and drumspeed at 170 and 175 rpm. Immediately after imaging, the Donor/Receiver sheets were removed and peeled apart to provide a printed layer on the receiver.

Figure 8:
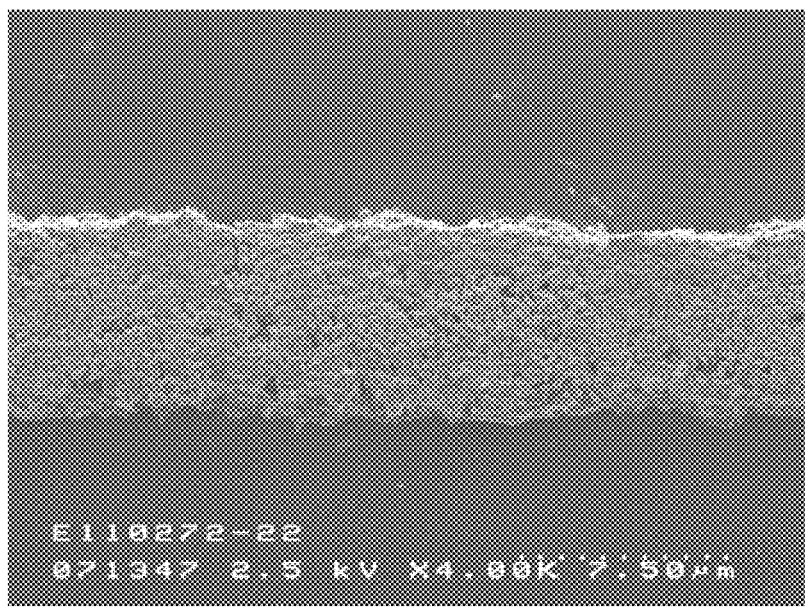
FIGS. 8 & 9 illustrate scanning electron micrographs at 4,000× magnification of patterned multilayer compositions of one embodiment of the invention.
Figure 9:
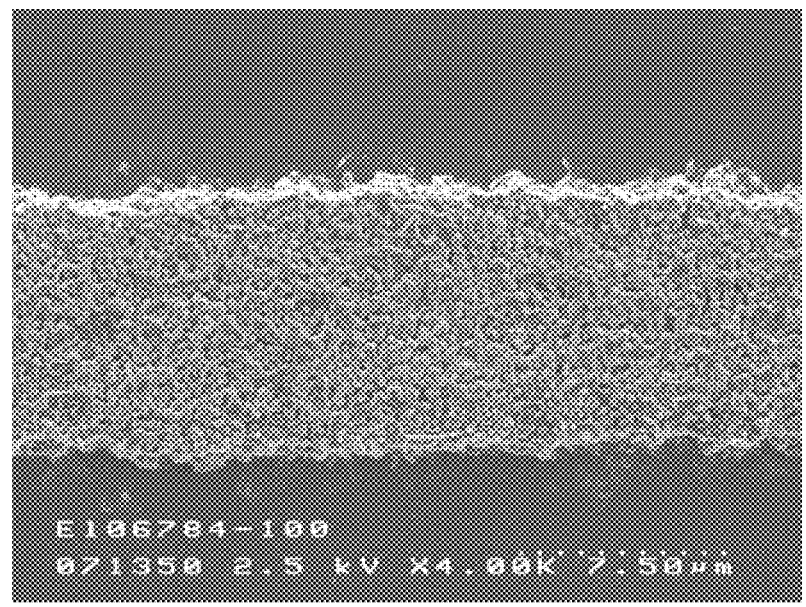

Other donors prepared using compositions from examples 2, 16 and 17 were printed using conditions listed in Table 2. Patterned metal layers provided by examples 18 and 19 are shown in FIGS. 8 and 9.

TABLE 2

Printing examples of the invention

| Ex. No. | Donor | Printing Condition | | | | Lowest Resistivity (Ohms-cm) |
|---|---|---|---|---|---|---|
| | | Drum Speed (rpm) | Surface Depth (micon) | Laser Power (W) | Pattern Printed | |
| 18 | Ex 1 | 170, 175 | 60 | 8.7, 8.8, 8.9, 10.5, 11.0, 11.5 | A FIG. 8 | $5.3 \times 10^{-5}$ |
| 19 | Ex 2 | 100 | 50, 60, 101 | 9, 11 | A FIG. 9 | $1.8 \times 10^{-5}$ |
| 20 | Ex 16 | 40, 80, 120 | 71 | 5.75-8.00 at 0.25 increments | B | $8 \times 10^{-5}$ |
| 21 | Ex 17 | 40, 70, 100 | 71 | 3.50-6.50 at 0.25 increments | B | $7 \times 10^{-5}$ |
| 22 | Ex 22 | 160 | 45 | 2.5, 4, 6, 8, 10, 12 | No print | |
| 23 | Ex 23 | 160 | 45 | 2.5, 4, 6, 8, 10, 12 | No print | |

A: 10 micron lines with spacing
B: 50, 100 and 200 micron lines with spacing.

Example 22

Comparative

Poly(propylene carbonate) (3.102 g, Aldrich, Mn=50,000) was added into Dimethylacetamide (DMAC) (13.86 g) and stirred overnight. Into this solution was added silver trifluoroacetate (7.101 g) and the mixture was stirred until dissolved (2 h). Ag powder (25.899 g, particle size d50=220 nm and d90=430 nm) and DMAC (10.0 g) were added to the mixture and the slurry dispersed and filtered as in Example 1 The dispersion (8 mL) was coated onto a 40% T Cr-PET donor substrate using a Color Versatility coater at 5.8 ft/min with #6 CN formed and dried at 42° C. for 45 min. The film did not transfer at all when using the same procedure as Example 18 under a wide range of exposures.

Example 23

Comparative

Poly(propylene carbonate) (3.102 g, Aldrich, Mn=50,000) was added into DMAC (23.855 g) and stirred overnight. Into this solution was added Ag powder (33.044 g, particle size d50=220 nm and d90=430 nm). The slurry was dispersed and filtered as in example 1. The dispersion (8 mL) was coated onto a 40% T Cr-PET donor substrate using a Color Versatility coater at 5.8 ft/min with a #7 CN formed rod and dried at 43° C. for 45 min. The film did not transfer at all using the procedure of Example 18 under a wide range of exposures.

The comparative examples, similar to formulations described in WO 03/035279, exhibited no transfer to receiver sheets, demonstrating that known compositions comprising conventional binders and silver powders were not sufficient to provide the desired patterned metal layers.

Example 24

This example illustrates the preparation of an EMI shield comprising a patterned multilayer composition of the invention.

A 91 wt % silver composition was prepared, following the procedure as described in example 1, using silver powder (22.72 g, d50/d90=870/1780), 20 wt % Elvacite® 2028 (11.29 g) and di(ethylenegylcol)dibenzoate (0.042 g). The final dispersion was filtered through 12 and 8μ stainless steel screens as in example 4. The dispersion was coated using the general procedure entitled "Donor Preparation" on organic LTHC Green PET donor substrate and dried at about 45° C. for 20 min to provide a multilayer donor.

The donor was imagined onto a Melinex® ST 504 receiver sheet using the general procedures entitled "Thermal Imaging Equipment and Donor Mounting". Printing pattern was: mesh/grid pattern of 50 micron lines with 500 micron center-to-center spacing. The printing condition was as: surface depth=70, drum speed=40 rpm and printing power=8.85 Watt.

Figure 10:
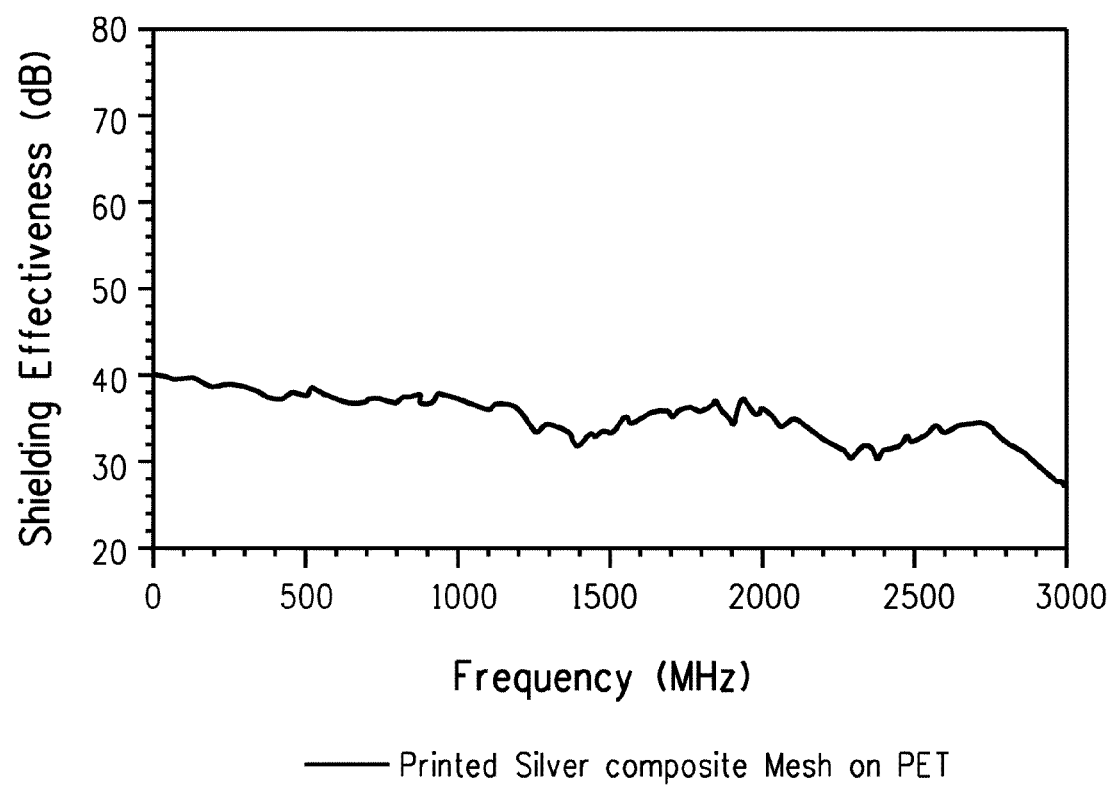
FIG. 10 illustrates the EMI shielding performance of a patterned multilayer composition of one embodiment of the invention.

The EMI shielding effectiveness in decibels (dB) of the example was determined as outlined in ASTM D4935-99, Standard Test Method for Measuring the Electromagnetic Shielding Effectiveness of Planar Materials, using a Hewlett-Packard HP8753C Vector Network Analyzer and Elgal SET-19A Shielding Effectiveness Tester. The EMI effectiveness was: 30-40 dB (0-2800 MHz) and 25-30 dB (2800-3000 MHz) as illustrated in FIG. 10.

Figure 11:
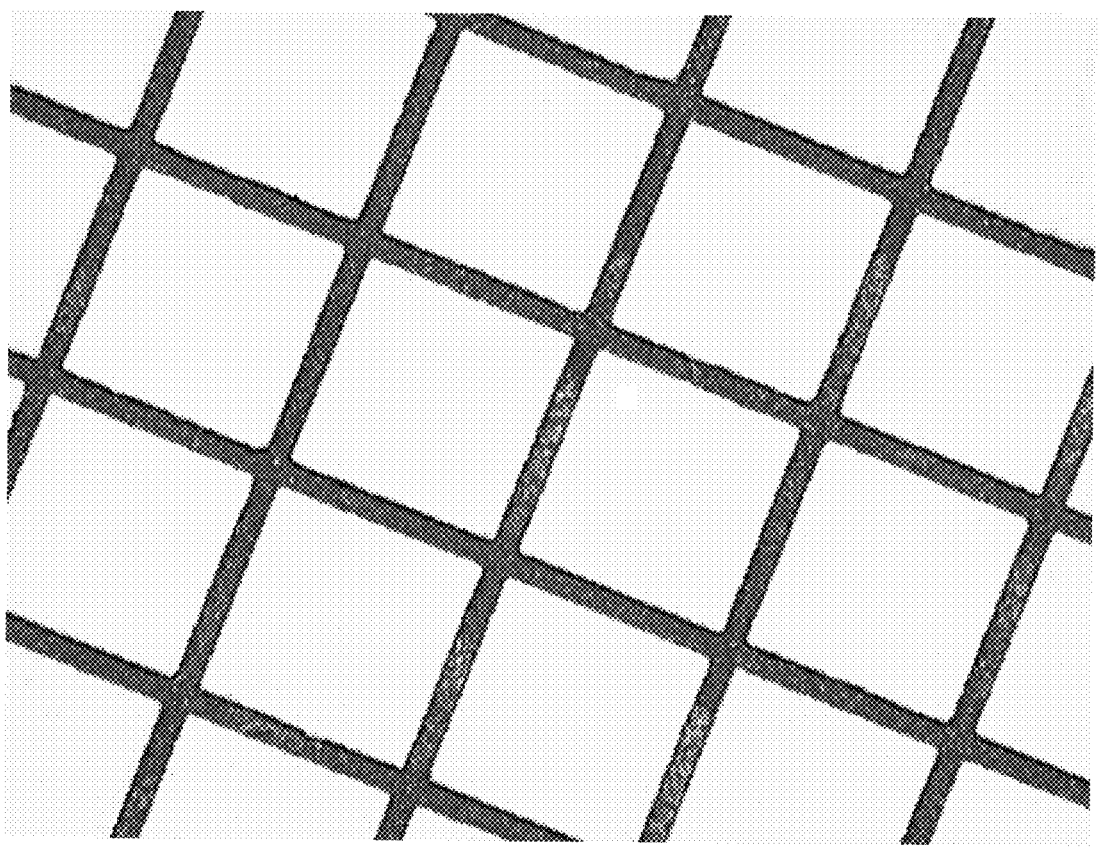
FIG. 11 is a photomicrograph at 5× magnification of an EMI shield of one embodiment of the invention.

FIG. 11 is a photomicrograph at 5× magnification of an EMI shielding element of the invention made in a similar manner to example 24.

Examples 25-30

Latex Binder Preparation for Examples 25-30

Latex binders that were used in the preparation of certain donor elements were prepared according to the procedures of WO 03/099574 with the materials reported in Table 3. The chain transfer agent solution used was that described on page 28 of the WO 03/099574. Compositions are reported in Table 4 and were characterized by the analytical methods reported in the same reference. Monomers and initiators were commercially available (Aldrich Chemical Co., Milwaukee, Wis.) and used as received. The surfactant was Polystep® B-7, a 29 wt % solution of ammonium lauryl sulphate in water (Stepan Co).

TABLE 3

Materials for the Synthesis of Latex Resins Used in Examples 25-30

| Reagent (grams) | Acrylic Latex Resin | | |
|---|---|---|---|
| | L-56-3 | L-33-3 | L-34-1 |
| Polystep ® B-7 | 6.90 | 6.90 | 6.90 |
| Ammonium Persulfate | 0.20 | 0.20 | 0.20 |
| Methyl Methacrylate (MMA) | 252.0 | 228.0 | 236.0 |
| Butyl Acrylate (BA) | 120.0 | 160.0 | 160.0 |
| Methacrylic Acid (MAA) | 12.0 | 12.0 | 4.0 |
| Chain Transfer Agent Solution | 16 | 0 | 0 |

TABLE 4

Composition and Analytical Data for Latex Resins Used in Examples 25-30

| Latex | Solids Wt % | MMA Wt % | BA Wt % | MAA Wt % | Chain Transfer Agent Solution Wt % | Particle Diameter (nm) | Tg (° C.) | Mn/ 1000 | Mw/ 1000 |
|---|---|---|---|---|---|---|---|---|---|
| L-56-3 | 32.6 | 63 | 30 | 3 | 4 | 75 | 56 | 57 | 135 |
| L-33-3 | 33.3 | 57 | 40 | 3 | 0 | 93 | 33 | 244 | 1399 |
| L-34-1 | 33.4 | 59 | 40 | 1 | 0 | 93 | 34 | 235 | 1539 |

MMA: Methyl Methacrylate;

BA: Butyl Acrylate;

MAA: Methacrylic Acid.

Preparation of Dispersions for Ag Layers of Examples 25-30

The dispersions were prepared according to the procedure for dispersing silver nanoparticles given in Example 1 with the materials reported in Table 5 with the exception that for entry 5 of Table 5, the dispersion was filtered through 12 and 8 micron stainless steel screens (Twill Dutch Weave, mesh count 200×1400 and 325×2300, absolute filter rating: 12-14 and 8 microns, Sefar America Inc., Depew, N.Y.).

TABLE 5

Materials for Ag Nanoparticle Layers of Examples 25-30

| Entry No. | Solvent (g)[a] | Metal Powder | | | Dispersant | | | Additives | |
|---|---|---|---|---|---|---|---|---|---|
| | | M/wt %[b] | d50/d90 (nm)[c] | Wt. (g) | ID | Wt % | Dry wt. (g) | ID[d] | Dry wt. (g) |
| 1 | Xylenes 15.006 | Ag/89.8 | 220/430 | 22.502 | Elvacite® 2028[e] | 20 | 2.501 | DGD | 0.057 |
| 2 | Xylenes 17.601 | Ag/88.8 | 350/730 | 20.042 | Elvacite® 2028[e] | 20 | 2.476 | DGD | 0.063 |
| 3 | DI H$_2$O 15.427 | Ag/87.1 | 220/430 | 26.250 | Joncryl® 538[f] | 45 | 3.762 | Zonyl FSA 25 wt %[g] | 0.133 |
| 4 | Xylenes 8.810 | Ag/88.6 | 350/730 | 10.031 | Elvacite® 2028[e] | 20 | 1.240 | DGD/ SDA 4733 | 0.026/ 0.027 |
| 5 | Xylenes 12.501 | Ag/89.9 | 870/1780 Flake | 22.564 | Elvacite® 2028[e] | 20 | 2.5002 | DGD | 0.046 |

[a]DI = deionized.
[b]Weight % of the metal in the dry film.
[c]Spherical particles were utilized unless indicated otherwise.
[d]DGD = diethylene glycol dibenzoate.
[e]Solution in xylenes.
[f]Solution in water.
[g]Solution in 1:1 water:isopropanol.

Example 25

PANI-CNT—Ag Nanoparticle Multi-Layer

This example illustrates the process of the invention wherein a thermal imaging substrate was fabricated with a base film; chrome LTHC layer; and polyaniline-carbon nanotube (PANI-CNT) and silver transfer layers in layered sequence. Thermal transfer onto a receiver comprising a surface-treated base film gave a receiver element with a base film, surface treatment, and patterned silver and PANI-CNT layers in layered sequence. Post-processing steps improved line-edge quality.

A. Preparation of PANI-CNT—Ag Nanoparticle Multi-Layer Donor Substrate (a) Preparation and coating of polyaniline layer. A mixture of HiPco Raw CNT (0.1219 g, from Carbon Nanotechnologies, Inc., Houston, Tex.), Disperbyk® 163 (0.067 g, BYK Chemie USA Inc., Wallingford, Conn.) 1,2-dichlorobenzene (8.855 g) and xylenes (20.662 g) was treated in a room temperature water bath with a sonication probe (Dukane Co. Model 40TP200, Transducer Model 41C28) for 10 minutes, during which time the mixture was stirred gently with a spatula at 5 minute intervals. Then PANI-DNNSA [7.325 g, 22.23% by wt. in xylenes and 2-butoxyethanol (4:1 ratio) with 0.7 acid doping, synthesized according to U.S. Pat. No. 5,863,465] was added into the above mixture and the mixture was placed in a 45° C. water bath for 5 minutes. After equilibration of the temperature, the mixture was treated with sonication for 5 minutes, during which time the mixture was stirred gently with a spatula at one-minute intervals. The resulting dispersion was filtered through 1.0 micron Nitex® 03-1/1 nylon screen (mesh count 690×470, Pore size: 1 micron, Sefar America Inc., Depew, N.Y.). Into the filtrate was added 30.5 microliter of a 10 wt % solution in xylenes of Triton® X 114 (Union Carbide Co, Danbury, Conn.). The dispersion (10.9 mL) was coated onto a 40% T Cr PET donor substrate (~90 by 52 cm) using a CV coater at 5.8 ft/min with a CN#12 formed Buschman rod and dried at 40° C. for 25 minutes.

(b) Preparation and coating of silver layer. The components of the silver formulation and dispersion are described in entry 2 of Table 5 above. The dispersion (7 mL) was coated onto the PANI-CNT layer on the 40% T Cr PET donor substrate using a CV coater at 5.8 ft/min with a CN#6 formed Buschman rod and dried at 48° C. for 20 minutes.

B. Thermal Transfer Process for Patterning PANI-CNT—Ag Nanoparticle Multi-Layer.

A portion of the multi-layer donor (~30 cm×20 cm) and a thermal imaging Melinex® ST 504 receiver (~28 cm×18 cm) were loaded into the Creo Trendsetter® 800 thermal platesetter according to the procedure described above. Blocks (4.75 cm×1.5 cm) of serpentine patterns were printed with 200, 100, and 50 micron line widths with spacing between the lines equivalent to the line width. Printing parameters were as follows: surface depth=47; surface reflectivity=0.52; escan=0. The patterns were printed at drum speed 120 (7.5-10.75 W in 0.25 W increments) and drum speed 60 (4.5-8 W in 0.25 W increments).

C. Thermal Transfer Evaluation and Post-Processing.

Transfer was incomplete at drum speed 60. Transfer was complete at drum speed 120 but, with the exception of the 200 micron lines printed at 9.25 W and above, material in non-exposed regions between the printed lines was transferred along with the lines. Contact of an adhesive surface (Scotch® tape, 60 sec) with the 50 micron lines printed at drum speed 120 at 9.75 W selectively removed the material between the lines to yield the desired 50 micron serpentine pattern on the receiver with clean line edges and no line breaks.

D. Electrical Characterization.

Sheet resistance was measured according to the standard procedure given above. Rsh of less than 1 ohm/sq was measured for lines printed at drum speed 120 at 7.75 W and above, with Rsh measuring 0.4 ohm/sq at 10 W and above.

Example 26

PANI-CNT—Ag Nanoparticle—Dielectric Multi-Layer

This example illustrates the process of the invention wherein a thermal imaging substrate was fabricated with a base film; chrome LTHC layer; and PANI-CNT, silver, and dielectric transfer layers in layered sequence. Thermal transfer onto a receiver comprising a surface-treated base film gave a receiver element with a base film, surface treatment, and patterned dielectric, silver and PANI-CNT layers in layered sequence. Thermal transfer onto a receiver comprising a surface-treated base film with a patterned PANI-CNT layer gave a receiver element with a base film, surface treatment, and patterned PANI-CNT, dielectric, silver and PANI-CNT layers in layered sequence. Post-processing steps improved line-edge quality.

A. Preparation of Multilayer PANI-CNT—Ag Nanoparticle—Dielectric Donor Substrate (a) Preparation and coating of polyaniline layer. Procedure was identical to that described above in Example 25-A-a.

(b) Preparation and coating of silver layer. The components of the silver formulation and dispersion are described in entry 3 of Table 5 above. The dispersion (5 mL) was coated onto the PANI-CNT layer on the 40% T Cr PET donor substrate (~90 by 52 cm) using a CV coater at 5.8 ft/min with a CN#7 formed Buschman rod and dried at 49° C. for 20 minutes. (c) Preparation and coating of dielectric layer. General aqueous dielectric layer formulation procedure was followed using 16.76 g of Joncryl® 63 (30 wt %), 16.78 g of Joncryl® 95 (30 wt %), 0.21 g of SDA 2860, 0.50 g of Byk® 348 (10 wt % in water), and 23.26 g of water to give a formulation with a pH of 8.51. The resulting solution (3 mL) was coated onto the silver nanoparticle layer with a CN#2 formed Buschman rod at 6.3 ft/min with a CV coater and dried at 45° C. for 6 minutes. The wt % of materials in the dried coating was as follows: 48.7 wt % Joncryl® 63, 48.8 wt % Joncryl® 95, 2.0 wt % SDA 2860, and 0.50 wt % Byk® 348. [Joncryl® 63 is a solution of a water-soluble styrene acrylic resin with a pH of 8.4, MW of 12,000, acid number of 213 and Tg of 73. Joncryl® 95 is an emulsion of an ammonia salt of modified styrene acrylic polymers with a pH of 8.0 and an acid number of 70. Both are from Johnson Polymer.]

B. Preparation of a Thermal Imaging Receiver with a Patterned PANI-CNT Layer (a) Preparation and coating of PANI-CNT donor substrate. Procedure and materials for the dispersion were identical to those of Example 25-A-a except that xylenes was used as the solvent instead of the xylenes/1,2-dichlorobenzene mixture. The amounts of materials utilized were as follows: 0.1230 g of HiPco Raw CNT, 0.063 g of Disperbyk® 163, 29.680 g of xylenes, 5.144 g of PANI-DNNSA [31.68% by wt. in xylenes and 2-butoxyethanol (4:1 ratio) with 0.7 acid doping], and 28.9 micro-L of Triton®X 114 (10 wt % in xylenes). The dispersion (10.9 mL) was coated onto a 40% T Cr PET donor substrate (~90 cm×52 cm) using a CV coater at 5.8 ft/min with CN#10 formed Buschman rod and dried at 45° C. for 20 minutes.

(b) Thermal transfer process for patterning PANI-CNT layer on base film of receiver. A portion of the PANI-CNT donor (~30 cm×20 cm; dried for an additional 60 min at 50° C. five months prior to the thermal transfer experiment) and a thermal imaging Melinex® ST 504 receiver (~28 cm×18 cm) were loaded into the Creo Trendsetter® 800 thermal platesetter according to the general procedure described above. Two rectangular patterns (1.25 cm×0.75 cm), one a solid block of material (herein referred to as the solid-block pattern) and one in which the material was patterned into vertical lines of 120 microns in width with spacing of 240 microns (herein referred to as the vertical-line pattern), were utilized as the patterns in this printing experiment. Two rows (rows 1 and 2) were printed with thirteen alternating solid-block and vertical-line patterns in each line. Printing parameters were as follows: drum speed=160; surface depth=47; surface reflectivity=0.46; escan=0; power=5.75 W (row 1) and 5.45 W (row 2).

C. Thermal Transfer Process for Patterning PANI-CNT—Ag Nanoparticle—Dielectric Multi-Layer.

The PANI-CNT donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=47; surface reflectivity=0.54; escan=0; alternating solid-block and vertical line patterns. Row 1: Multi-layer printed on top of the patterned PANI-CNT layer at drum speed 120 from 7.50 to 10.50 W in 0.25 W increments. Row 2: Multi-layer printed on top of the patterned PANI-CNT layer at drum speed 160 from 9.00 to 12.00 W in 0.25 W increments. Row 3: Multi-layer printed onto the receiver surface at drum speed 160 from 7.50 to 10.50 W in 0.25 W increments.

D. Thermal Transfer Evaluation and Post-Processing.

The multilayer transferred to varying extents at all powers with optimal quality and highest degree of transfer observed at 7.5-8.25 W for Row 1, 9.25-10 W for Row 2, and 8-8.25 W for Row 3. In all three rows, material in non-exposed regions between the printed lines was transferred along with the lines. The material that was transferred between the lines was very loosely adhered to the receiver and to the lines themselves and could be easily and selectively removed by contact with an adhesive surface, leaving the desired line pattern on the receiver. This was exemplified in Row 1 (10.5 W), Row 2 (12.0 W) and Row 3 (10.5 W) using a tacky roller and in Row 3 (10.25 W) using Scotch® tape (1 min contact).

Example 27

Black—Ag Nanoparticle—Dielectric Multi-Layer

This example illustrates the process of the invention wherein a thermal imaging substrate was fabricated with a base film; chrome LTHC layer; and black, silver, and dielectric transfer layers in layered sequence. Thermal transfer onto a receiver comprising a surface-treated base film gave a receiver element with a base film, surface treatment, and patterned dielectric, silver and black layers in layered sequence. Thermal transfer onto a receiver comprising a surface-treated base film with a patterned PANI-CNT layer gave a receiver element with a base film, surface treatment and patterned PANI-CNT, dielectric, silver and black layers in layered sequence. Thermal transfer onto a receiver comprising a surface-treated base film with a patterned silver nanoparticle layer gave a receiver element with a base film, surface treatment and patterned silver, dielectric, silver and black layers in layered sequence. Post-processing steps improved line-edge quality.

A. Preparation of Multilayer Black—Ag Nanoparticle—Dielectric Donor Substrate (a) Preparation and coating of black layer. General aqueous transfer layer formulation procedure was followed using 12.60 g of Joncryl® 56 (27 wt %), 4.93 g of Latex L-34-1 (30 wt %), 0.025 g of SDA 2860, 0.050 g of Byk® 348, 0.910 g of Carbon Black Acroverse Paste 32B56 (33 wt %; Penn Color), and 11.60 g of water to give a formulation with a pH of 9.20. The resulting solution (3 mL) was coated onto the 40% T Cr Blue PET donor substrate (~90 by 52 cm) using a CV coater with a CN#2 formed Buschman rod at 6.3 ft/min and dried at 45° C. for 6 minutes. The wt % of materials in the dried coating was as follows: 63.0 wt % Joncryl® 56, 30.1 wt %

Latex L-34-1, 0.5 wt % SDA 2860, 0.90 wt % Byk® 348, and 5.6 wt % 32B56 Carbon Black. [Joncryl® 56 is a solution of a water-soluble styrene acrylic resin with a pH of 9.1, MW of 4,600, acid number of 108 and Tg of 60 from Johnson Polymer.]

(b) Preparation and coating of silver layer. The components of the silver formulation and dispersion are described in entry 1 in Table 5 above. The dispersion (7 mL) was coated onto the black layer on the 40% T Cr Blue PET donor substrate using a CV coater at 5.8 ft/min with a CN#6 formed Buschman rod and dried at 48° C. for 20 min and later for 60 min at 50° C.

(c) Preparation and coating of dielectric layer. Formulation and coating process were identical to that of Example 26-A-c. The donor was dried for an additional 45 min at 45° C. immediately prior to the thermal transfer experiment.

B. Preparation of a Thermal Imaging Receiver with a Patterned PANI-CNT Layer in Rows 1 and 2 and a Patterned Silver Nanoparticle Layer in Row 3

(a) Preparation and coating of PANI-CNT donor substrate. Formulation and coating were identical to that of Example 26-B-a.

(b) Thermal transfer process for patterning PANI-CNT layer on base film of receiver. Process was identical to that of Example 26-B-b with the following exceptions: surface reflectivity=0.54; power=5.5 W (Rows 1 & 2), fourteen alternating patterns were printed in Row 2.

(c) Preparation and coating of silver nanoparticle donor substrate. The components of the silver formulation and dispersion are described in entry 4 in Table 5 above. The dispersion (8 mL) was coated onto Melinex® 453 donor film (~90 by 52 cm) using a CV coater at 5.8 ft/min with a CN#6 formed Buschman rod and dried at 47° C. for 20 min. The donor was dried for an additional 60 min at 50° C. approximately three weeks prior to the thermal transfer experiment.

(d) Thermal transfer process for patterning silver nanoparticle layer on base film of receiver. The PANI-CNT donor was removed from the drum while leaving the patterned receiver in place on the drum. A portion of the silver nanoparticle donor (~30 cm×20 cm) was loaded into the Creo Trendsetter® 800 thermal platesetter according to the general procedure described above. Fourteen alternating solid-block patterns and vertical-line patterns (1.25×0.75 cm) were printed in Row 3. Printing parameters were as follows: drum speed=40; surface depth=30; surface reflectivity=0.48; escan=0; power=4.8 W.

C. Thermal Transfer Process for Patterning Black—Ag Nanoparticle—Dielectric Multi-Layer.

The silver nanoparticle donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=60; surface reflectivity=0.30; escan=0; alternating solid-block and vertical line patterns (1.25×0.75 cm). Row 1: Multi-layer was printed directly on top of the patterned PANI-CNT layer at drum speed 40 from 4.00 to 7.25 W in 0.25 W increments. Row 2: Multi-layer was printed on top of and slightly offset from the patterned PANI-CNT layer at drum speed 100 from 6.00 to 9.25 W in 0.25 W increments. Row 3: Multi-layer was printed on top of the patterned silver nanoparticle layer at drum speed 40 from 3.50 to 7.40 W in 0.30 W increments. Row 4: Multi-layer was printed onto the receiver surface at drum speed 40 from 3.50 to 7.40 W in 0.30 W increments.

D. Thermal Transfer Evaluation and Post-Processing.

Complete transfer of the multilayer was observed at 4.5 W for Row 1, at 3.75-4.75 W for Row 3 and at 3.5-4.5 W for Row 4. For Row 2, the offset multilayer transferred to varying extents at the different powers onto both the patterned PANI-CNT layer and onto the receiver. In all four rows, some material in non-exposed regions between the printed lines was transferred along with the lines. For Rows 3 and 4, the material that was transferred between the lines could be easily and selectively removed by contact with an adhesive surface, leaving the desired line pattern on the receiver. This was exemplified in Row 3 (4.75 W) and Row 4 (3.75 W) with Scotch® tape (30-60 sec contact).

Example 28

Black—Dielectric—Ag Nanoparticle Multi-Layer

This example illustrates the process of the invention wherein a thermal imaging substrate was fabricated with a base film; organic LTHC layer; and black, dielectric and silver transfer layers in layered sequence. Thermal transfer onto a receiver comprising a surface-treated base film gave a receiver element with a base film, surface treatment, and patterned silver, dielectric, and black layers in layered sequence. Thermal transfer onto a receiver comprising a surface-treated base film with a patterned dielectric layer gave a receiver element with a base film, surface treatment, and patterned dielectric, silver, dielectric, and black layers in layered sequence.

A. Preparation of Multilayer Black—Dielectric—Ag Nanoparticle multi-layer donor substrate (a) Preparation and coating of black layer. General aqueous black layer formulation procedure was followed using 11.10 g of Joncryl® 56 (27 wt %), 0.135 g of ammonium hydroxide (3 wt % in water), 0.060 g of SDA 2860, 0.20 g of Byk® 348 (10 wt % in water), 3.110 g of Carbon Black Acroverse Paste 32B56 (33 wt %; Penn Color), and 8.28 g of water to give a formulation with a pH of 9.34. The resulting solution (3 mL) was coated onto an Organic LTHC Green PET donor substrate (~90 by 52 cm) using a CV coater with a CN#2 formed Buschman rod at 6.3 ft/min and dried at 45° C. for 6 minutes. The wt % of materials in the dried coating was as follows: 73.0 wt % Joncryl® 56, 0.1 wt % Ammonium Hydroxide, 1.5 wt % SDA 2860, 0.50 wt % Byk® 348, and 25.0 wt % 32B56 Carbon Black.

(b) Preparation and coating of dielectric layer. Formulation and coating process were identical to that of Example 26-A-c.

(c) Preparation and coating of silver layer. Formulation and coating process were identical to that of Example 27-A-b.

B. Preparation of a Thermal Imaging Receiver with a Patterned Dielectric Layer in Rows 1, 2, 5 and 6.

(a) Preparation and coating of dielectric donor substrate. General aqueous dielectric layer formulation procedure was followed using 33.32 g of Latex L-56-3 (30 wt %), 12.34 g of Latex L-33-3 (30 wt %), 0.87 g of SDA 2860, 0.165 g of Byk® 345, 4.164 g of 2-butoxyethanol, and 38.85 g of water to give a formulation with a pH of 3.84. The resulting solution (7 mL) was coated onto the Organic LTHC Green PET donor substrate (~90 by 52 cm) with a CN#7 formed Buschman rod with a CV coater at 9.8 ft/min and dried at 45° C. for 6 minutes. The wt % of materials in the dried coating was as follows: 68.3 wt % Latex L-56-3, 25.3 wt % Latex L-33-3, 5.4 wt % SDA 2860, and 1.0 wt % Byk® 345.

(b) Thermal transfer process for patterning dielectric layer on base film of receiver. A portion of the dielectric donor (~30 cm×20 cm) and a thermal imaging Melinex® ST 504 receiver (~28 cm×18 cm) were loaded into the Creo Trendsetter® 800 thermal platesetter according to the general procedure described above. Seventeen solid-block patterns were printed in Rows 1 and 5 and seventeen vertical-line patterns were printed in Rows 2 and 6. Printing parameters were as follows: drum speed=160; surface depth=70; surface reflectivity=0.30; escan=0; power=9.70 W (rows 1 and 5) and 10.30 W (rows 2 and 6). Patterns were 1.9×1.3 cm.

C. Thermal Transfer Process for Patterning Black—Dielectric—Ag Nanoparticle Multi-Layer.

The dielectric donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=70; surface reflectivity=0.24; escan=0; drum speed=60. Row 1: The multi-layer was printed in solid-block patterns on top of the patterned dielectric layer from 4.50 to 9.30 W in 0.30 W increments. Row 2: The multi-layer was printed in vertical-line patterns on top of the patterned dielectric layer from 5.20 to 10.00 W in 0.30 W increments. Row 3: The multi-layer was printed in alternating vertical-line and solid-block patterns onto the receiver from 5.20 to 10.80 W in 0.40 W increments. Patterns were 1.9×1.3 cm for Rows 1 and 2 and 1.9×0.8 cm for Row 3.

D. Evaluation of Thermal Transfer of Multi-Layer.

Complete transfer of the Ag portion of the multilayer donor was exhibited in exposed regions along with complete transfer of the dielectric and black portions of the multilayer, except at some swath boundaries and coating defects, at 4.5-7.5 W for Row 1, at 5.2-10.0 W for Row 2, and at 5.2-6.7 W for Row 3 with the best line-edge quality for Row 3 observed at 5.2-5.8 W.

Example 29

Dielectric—Ag Nanoparticle Bi-Layer

This example illustrates the process of the invention wherein a thermal imaging substrate was fabricated with a base film; chrome LTHC layer; and dielectric and silver transfer layers in layered sequence. Thermal transfer onto a receiver comprising a surface-treated base film gave a receiver element with a base film, surface treatment and patterned silver and dielectric layers in layered sequence. Thermal transfer onto a receiver with a surface-treated base film with a patterned dielectric layer gave a receiver element with a base film, surface treatment and patterned dielectric, silver, and dielectric layers in layered sequence. Selective removal from the receiver of the patterned dielectric layer only of the patterned bi-layer and also of both layers of the patterned bi-layer was achieved in post-processing steps by tuning transfer conditions. These steps illustrate selective removal of a carrier layer and also transfer of a printed pattern from the receiver to another surface.

A. Preparation of Dielectric—Ag Nanoparticle Bi-Layer Donor Substrate (a) Preparation and coating of dielectric layer. Formulation was identical to that of Example 28-B-a. The resulting solution (3 mL) was coated onto the 40% T Cr Blue PET donor substrate (~90 by 52 cm) with a CN#2 formed Buschman rod with a CV coater at 9.8 ft/min and dried at 45° C. for 6 minutes.

(b) Preparation and coating of silver layer. Formulation and coating process were identical to that of Example 27-A-b.

B. Preparation of a Thermal Imaging Receiver with a Patterned Dielectric Layer in Rows 1, 2, 5 and 6.

Rows 4, 5 and 6 of the thermal imaging receiver prepared in Example 28, referred to herein as Receiver A, were utilized and are referred to in the present example as Rows A4, A5 and A6. A separate, non-patterned ST504 Melinex® receiver, referred to herein as Receiver B, was also utilized (Rows B1, B2, B3 and B4).

C. Thermal Transfer Process for Patterning Dielectric—Ag Nanoparticle Bi-Layer.

The multilayer donor of Example 28 was removed from the drum while leaving the patterned Receiver A in place on the drum. A portion of the dielectric-Ag nanoparticle bi-layer donor of the present example (~30 cm×20 cm) was loaded into the Creo Trendsetter® 800 thermal platesetter according to the general procedure described above. Printing parameters for all rows of both receivers were as follows: surface depth=70; surface reflectivity=0.24; escan=0. Following the printing of rows A4, A5 and A6, the bi-layer donor was peeled off of Receiver A, and Receiver A was then removed from the drum. Next, Receiver B and the bi-layer donor were loaded into the Creo Trendsetter® 800 thermal platesetter according to the general procedure. Rows B1, B2, B3 and B4 were printed. The bi-layer was printed onto a receiver surface in Row A4 (alternating vertical-line and solid-block patterns; 4.50 to 10.10 W in 0.40 W increments; drum speed 60), Row B1 (vertical-line patterns; 6.00 to 10.50 W in 0.25 W increments; drum speed 120), Row B2 (solid-block patterns; 5.00 to 9.50 W in 0.25 W increments; drum speed 120), Row B3 (vertical-line patterns; 8.00 to 12.50 W in 0.25 W increments; drum speed 160), and Row B4 (solid-block patterns; 7.00 to 11.50 W in 0.25 W increments; drum speed 160). The bi-layer was printed onto the patterned dielectric layer in Row A5 (solid block patterns; 4.50 to 9.30 W in 0.30 W increments; drum speed 60) and Row A6 (vertical-line patterns; 5.00 to 9.80 W in 0.30 W increments; drum speed 60). Patterns were 1.9×0.8 cm for Row A4, 1.9×1.3 cm for Rows A5 and A6, and 1.3×1.0 cm for Rows B1, B2, B3 and B4.

D. Thermal Transfer Evaluation and Post-Processing.

Bi-layer transferred at all powers with complete and highest quality of transfer observed at 4.5-4.9 W for Row A4; at 4.5 W for Row A5; at 5.3-5.6 W for Row A6 with good line-edge quality; at 6.5 W and above for Row B1 with optimal transfer with straight line edges at 7.25 W; at 8.25 W and above for Row B2; at 8.75-9 W and at 12-12.5 W for Row B3; and at 10.25 W and above for Row B4. Contact with an adhesive surface (Scotch® tape, 30 sec) selectively removed the dielectric layer only of the bi-layer, leaving the Ag lines on the receiver, for the vertical line pattern of 7.7 W of Row A4. Contact with an adhesive surface (Scotch® tape, 60 sec) selectively removed both layers of the bi-layer from the receiver and transferred the pattern to the surface of the tape for the 8.25 W patterns of Row B2 (greater than 90% removal) and Row B4 (greater than 95% removal).

Example 30

Ag Nanoparticle—Dielectric Multi-Layer

This example illustrates the process of the invention wherein a thermal imaging substrate was fabricated comprising a base film; organic LTHC layer; and silver and dielectric transfer layers in layered sequence. Thermal transfer to a receiver comprising a surface-treated base film gave a receiver element with a base film, surface treatment and patterned dielectric and silver transfer layers in layered sequence. Post-processing steps improved line-edge quality.

A. Preparation of Ag Nanoparticle—Dielectric Multi-Layer Donor Substrate (a) Preparation and coating of silver layer. The components of the silver formulation and dispersion are described in entry 5 of Table 5 above. The dispersion (14 mL) was coated onto an Organic LTHC Green PET donor substrate (~90 by 52 cm) using a CV coater at 5.8 ft/min with a CN#10 formed Buschman rod and dried at 47° C. for 20 minutes to give a film with a thickness of 2.9 microns.

(b) Preparation and coating of dielectric layer. Formulation and coating were identical to that of Example 26-A-c. The donor was dried for an additional 60 min at 50° C. immediately prior to the thermal transfer experiment.

B. Thermal Transfer Process for Patterning Ag Nanoparticle—Dielectric Multi-Layer.

A portion of the multi-layer donor (~30×20 cm) and a thermal imaging Melinex® ST 504 receiver (~28 cm×18 cm) were loaded into the Creo Trendsetter® 800 thermal platesetter according to the procedure described above. Blocks of serpentine patterns were printed with 200, 100, and 50 micron line widths with spacing between the lines equivalent to the line width. Printing parameters were as follows: surface depth=70; surface reflectivity=0.3; escan=0. The patterns were printed at drum speed 120 (8.5-12 W in 0.25 W increments), drum speed 60 (5.5-9 W in 0.25 W increments), and drum speed 40 (5-8.5 W in 0.25 W increments).

C. Thermal Transfer Evaluation and Post-Processing.

Transfer was complete at all drum speeds and powers with the exception of drum speed 120 at 8.5-9.25 W. For the 100 and, particularly, 50 micron lines, material in non-exposed regions between the printed lines was transferred along with the lines. Contact with an adhesive surface (Scotch tape, 60 sec) selectively removed the material between the 50 micron serpentine lines that were printed with drum speed 40 at 8.25 W to yield the desired pattern on the receiver with clean line edges and no line breaks.

Example 31

Printed Touchpad Component Utilizing Patterned Ag-Nanoparticle Layers

This example illustrates the preparation of a touchpad component comprising a multi-layer composition of the invention.

A. Preparation and Coating of Silver Layer.

The silver formulation and dispersion were prepared as described in Example 1. The dispersion (7 mL) was coated onto a 40% T Cr PET donor substrate (~90 by 52 cm) using a CV coater at 5.8 ft/min with a CN#6 formed Buschman rod and dried at 47° C. for 20 minutes. Two days later, the coating was further dried for ~1 h at 50° C.

B. Thermal Transfer Process for Patterning Ag Nanoparticle Layer.

A portion of the donor (~30 cm×20 cm) and Melinex® ST504 receiver (~28 cm×18 cm) was loaded into the Creo Trendsetter® 800 thermal platesetter according to the general procedure described above. Printing parameters were as follows: surface depth=65; surface reflectivity=0.65; escan=0. Two blocks (~9 cm×16 cm) consisting of a standard touchpad pattern of spiraling, rectangular parallel lines of 10 micron width with 2.1 mm spacing were printed at drum speed 160 at 11.65 W. Larger alignment crossbars and pads were printed at the four corners of each 9×16 block at drumspeed 170 at 8.40 W.

C. Evaluation of Thermal Transfer of Multi-Layer.

Transfer of both the lines and crossbars and pads was essentially complete and of good quality with straight line edges.

D. Construction of the Touchpad Component.

Each of the two printed 9×16 cm touchpad patterns was cut from the receiver. A sheet of 8142 optically clear adhesive (3M) was trimmed to match the size of the printed 9×16 cm touchpad patterns. The adhesive cover sheets were removed as it was attached to the backside (side opposite the silver pattern) of one of the printed touchpad patterns and the front side (side containing the silver pattern) of the other printed touchpad pattern, using the crossbars and pads to visually align the two patterns. The result was a touchpad component containing a base film, patterned silver lines, adhesive, base film and patterned silver lines in layered sequence. The UV-VIS transmission of the touchpad component was measured in an area with the silver pattern and in an area without the silver pattern. Transmission from 500-1100 nm was 87% for the patterned area and 89% for the non-patterned area.

What is claimed is:

1. A metal composition comprising:
   a) about 65 to about 95 wt %, based on the total weight of the metal composition, of a metal powder selected from the group consisting of: Ag, Cu and alloys thereof; comprising a plurality of metal particles having an average longest dimension of about 5 nm to about 1500 nm;
   b) about 5 to about 35 wt % of a dispersant comprising one or more resins selected from the group of nonconducting polymers consisting of:
      combinations of acrylic latexes with solution-based acrylic (co)polymers, combinations of acrylic latexes with styrenic-acrylic (co)polymers, combinations of styrenic-acrylic latexes with solution-based acrylics (co)polymers, combinations of styrenic-acrylic latexes with solution-based styrenic-acrylic (co)polymers, combinations thereof, and copolymers of ethylene with one or more monomers selected from the group consisting of (meth)acrylate(s), vinyl acetate, carbon monoxide and (meth)acrylic acid; and
   c) a near infrared dye selected from the group consisting of indocyanines, phthalocyanines, and merocyanines.

2. The metal composition of claim 1, further comprising up to about 10 wt %, based on the total weight of dispersant, of one or more additive(s) selected from the group consisting of: pigments, dyes, and conducting particles with an average longest dimension of about 5 nm to about 1500 nm, said conducting particles selected from the group consisting of: carbon black, carbon nanotubes, Au, Pd, and alloys of Au and Pd.

3. The metal composition of claim 1, comprising Ag powder with an average particle size of about 100 nm to about 400 nm.

* * * * *